US010229903B2

(12) United States Patent
Kodama

(10) Patent No.: US 10,229,903 B2
(45) Date of Patent: Mar. 12, 2019

(54) SEMICONDUCTOR DEVICE WITH A RESISTANCE ELEMENT AND AN ELECTROSTATIC PROTECTION ELEMENT

(71) Applicant: Renesas Electronics Corporation, Tokyo (JP)

(72) Inventor: Eisuke Kodama, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/635,441

(22) Filed: Jun. 28, 2017

(65) Prior Publication Data

US 2018/0076191 A1    Mar. 15, 2018

(30) Foreign Application Priority Data

Sep. 14, 2016   (JP) .................................. 2016-179331

(51) Int. Cl.
*H01L 27/02* (2006.01)
*H01L 27/06* (2006.01)
*H01L 23/535* (2006.01)
*H01L 27/07* (2006.01)

(52) U.S. Cl.
CPC ........ *H01L 27/0248* (2013.01); *H01L 23/535* (2013.01); *H01L 27/0288* (2013.01); *H01L 27/067* (2013.01); *H01L 27/0772* (2013.01)

(58) Field of Classification Search
CPC ............... H01L 27/0248; H01L 27/067; H01L 23/535; H01L 27/0722; H01L 27/0288
See application file for complete search history.

(56) References Cited

U.S. PATENT DOCUMENTS

| 4,578,695 | A | * | 3/1986 | Delaporte | ........... | H01L 27/0229 257/296 |
| 4,977,476 | A | * | 12/1990 | Marshall | ............. | H01L 27/0248 257/570 |
| 5,187,562 | A | * | 2/1993 | Becker | ................ | H01L 27/0248 257/539 |
| 5,521,783 | A | * | 5/1996 | Wolfe | ................. | H01L 27/0251 257/358 |
| 5,661,332 | A | * | 8/1997 | Nakamura | .......... | H01L 29/8605 257/528 |
| 5,821,601 | A | * | 10/1998 | Yamamoto | .......... | H01L 27/0248 257/545 |
| 2005/0218454 | A1 | * | 10/2005 | Saiki | .................... | H01L 27/0288 257/355 |
| 2007/0173026 | A1 | * | 7/2007 | Zeng | ................... | H01L 27/0658 438/320 |

FOREIGN PATENT DOCUMENTS

JP         07-211510 A      8/1995

* cited by examiner

*Primary Examiner* — Cheung Lee
*Assistant Examiner* — Stephen C Smith
(74) *Attorney, Agent, or Firm* — Mattingly & Malur, PC

(57) ABSTRACT

In a semiconductor device including a resistance element, an electrostatic protection element, including a parasitic bipolar transistor having the resistance element as a component, is provided. That is, instead of providing a dedicated electrostatic protection element in a semiconductor device, a function as an electrostatic protection element is also achieved by using a resistance element provided in a semiconductor device.

15 Claims, 24 Drawing Sheets

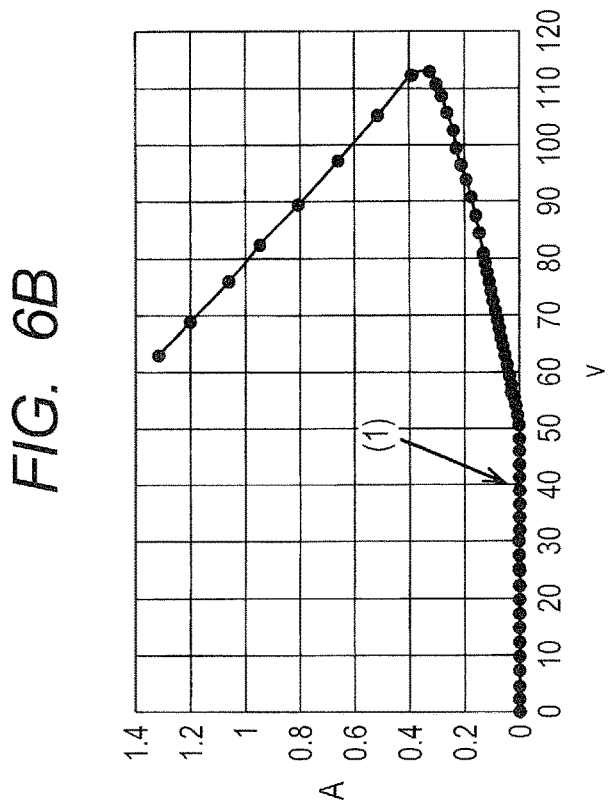
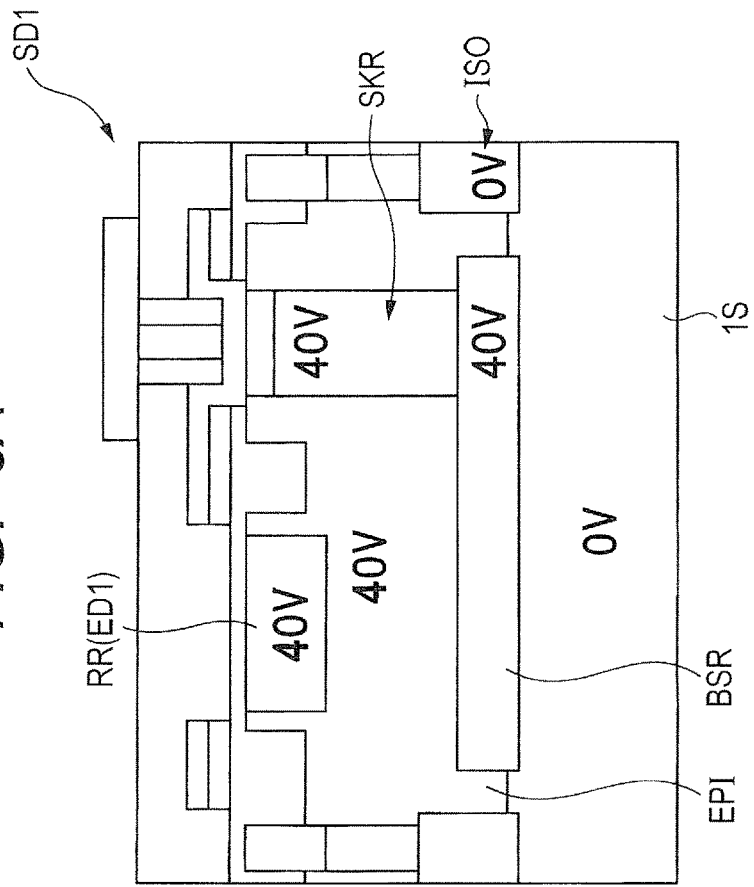

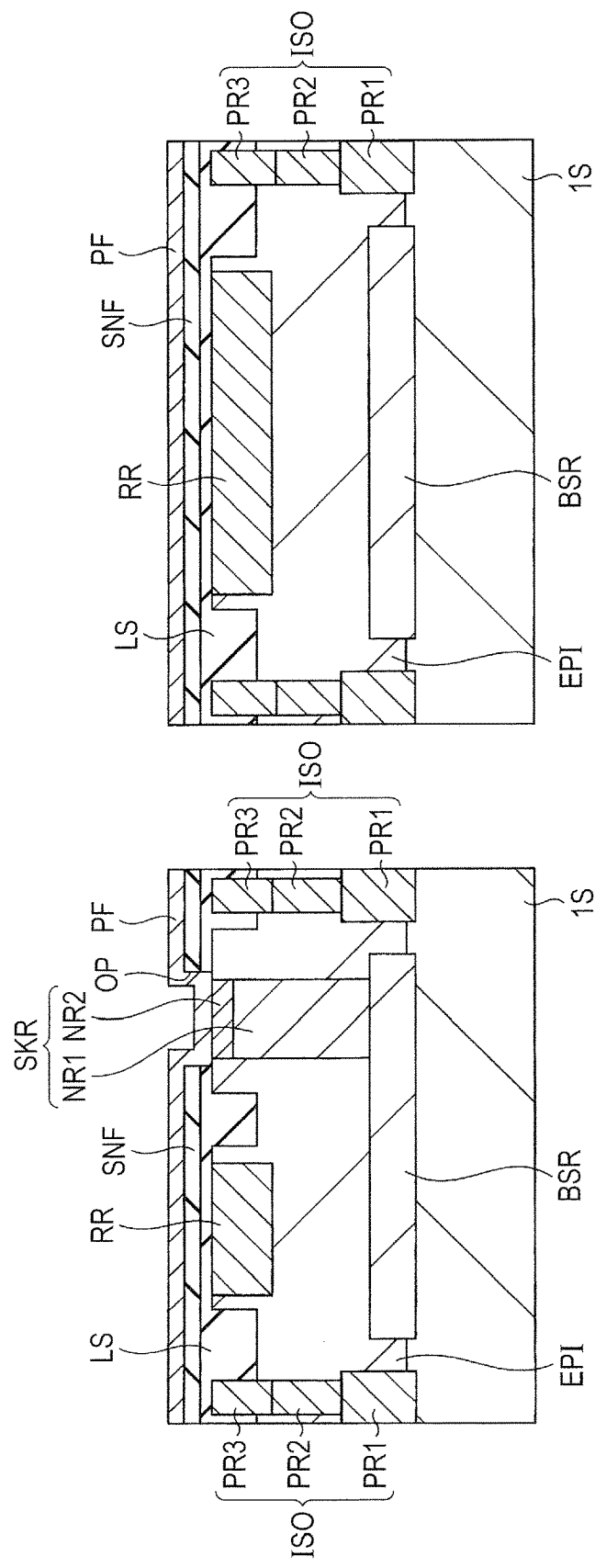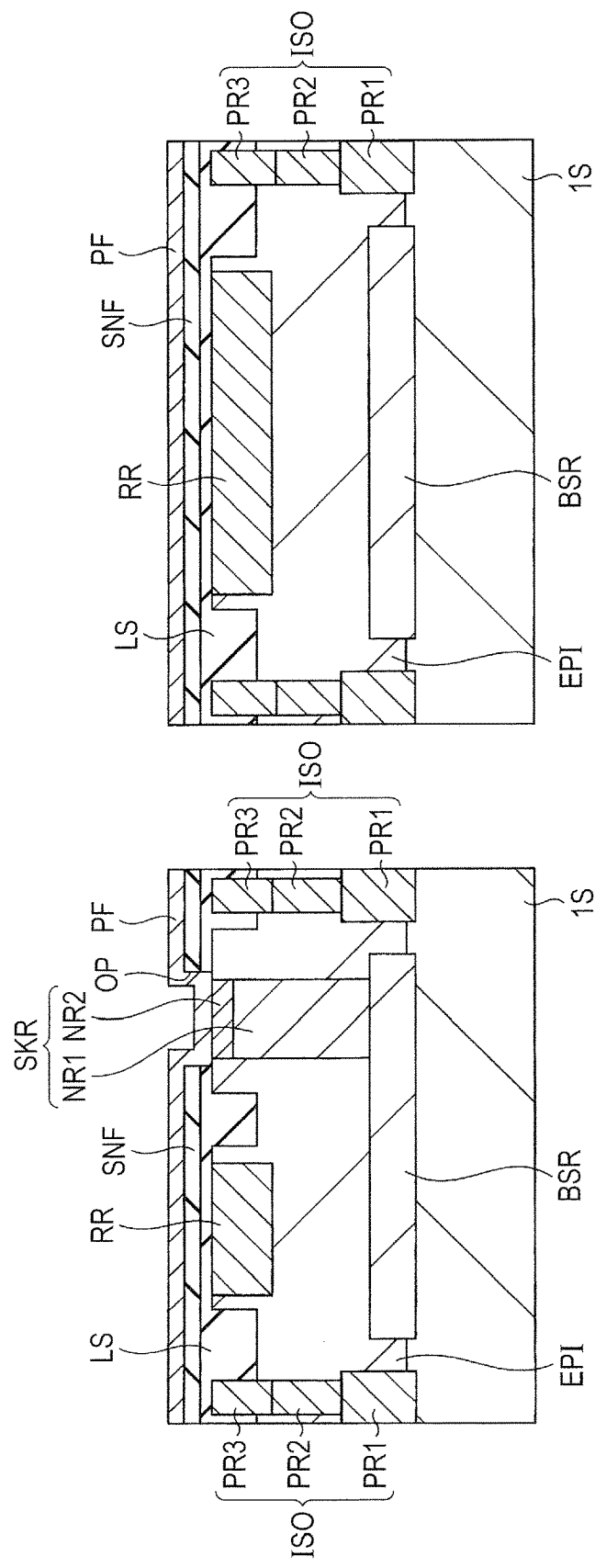

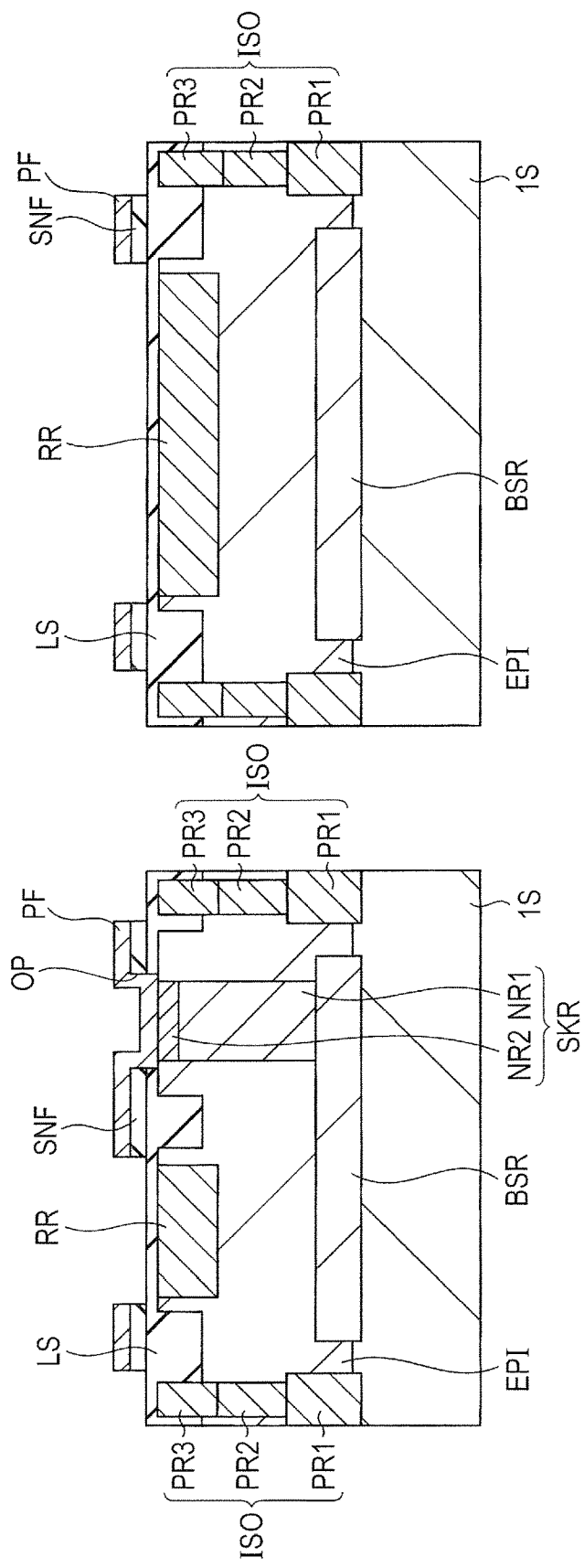

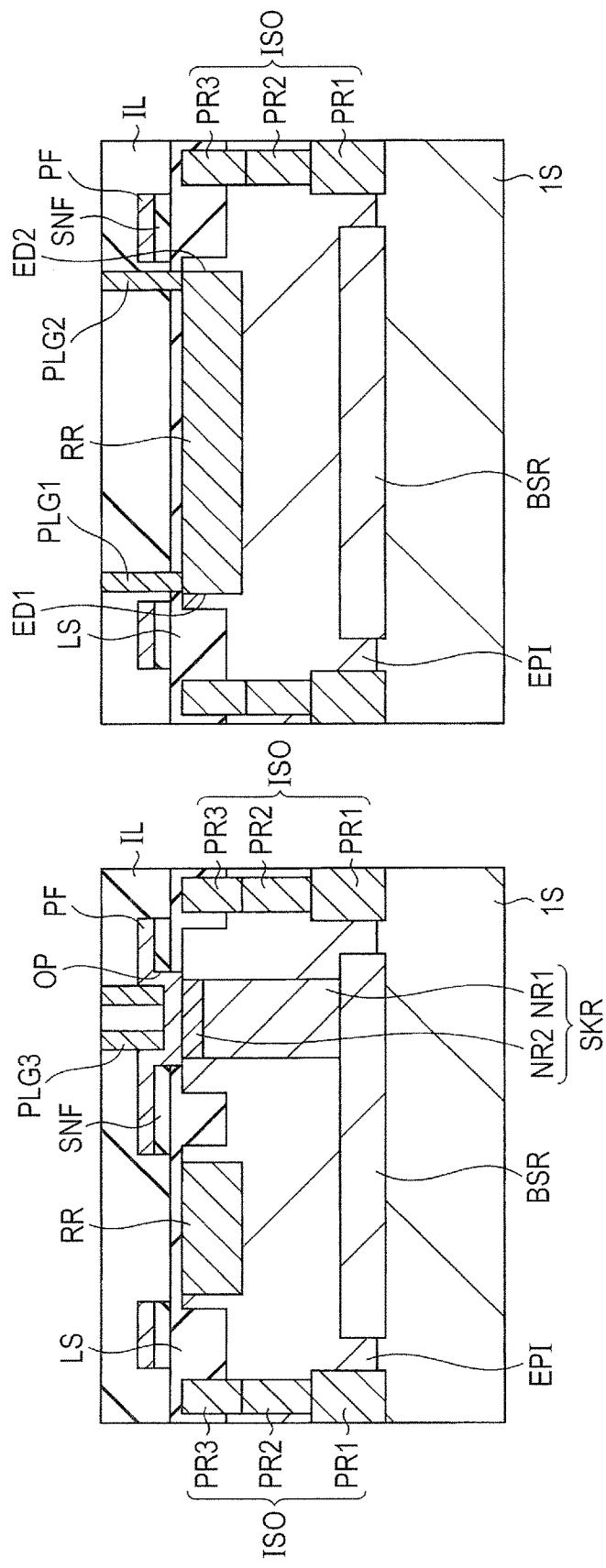

SEMICONDUCTOR DEVICE WITH A RESISTANCE ELEMENT AND AN ELECTROSTATIC PROTECTION ELEMENT

CROSS-REFERENCE TO RELATED APPLICATIONS

The disclosure of Japanese Patent Application No. 2016-179331 filed on Sep. 14, 2016 including the specification, drawings and abstract is incorporated herein by reference in its entirety.

BACKGROUND

The present invention relates to a semiconductor device, and, for example, to a technique that can be effectively applied to a semiconductor device having a resistance element.

Japanese Unexamined Patent Application Publication No. Hei 7(1995)-211510 (Patent Document 1) describes a technique relating to a semiconductor device having a diffusion resistance in which a parasitic bipolar transistor does not operate even if a leakage current occurs at high temperature.

RELATED ART DOCUMENT

Patent Document

[Patent Document 1] Japanese Unexamined Patent Application Publication No. Hei 7(1995)-211510

SUMMARY

In a semiconductor device, an electrostatic breakdown tolerance is required to prevent breakdown of the semiconductor device caused by static electricity. For this reason, an electrostatic protection element is provided in a semiconductor device in order to improve the electrostatic breakdown tolerance.

However, the miniaturization of a semiconductor device is hindered when a dedicated electrostatic protection element that is not related to the original operation of the semiconductor device is provided, and hence it is desired to improve the electrostatic breakdown tolerance of a semiconductor device without sacrificing the miniaturization thereof.

Other problems and new characteristics will become clear from the description and accompanying drawings of the present specification.

In a semiconductor device having a resistance element according to one embodiment, an electrostatic protection element including a parasitic bipolar transistor having this resistance element as a component is provided. That is, instead of providing a dedicated electrostatic protection element in a semiconductor device of one embodiment, a function as an electrostatic protection element is also achieved by using a resistance element provided in the semiconductor device.

According to one embodiment, the electrostatic breakdown tolerance of a semiconductor device can be improved without sacrificing the miniaturization thereof.

BRIEF DESCRIPTION OF THE DRAWINGS

FIG. 6A is a schematic view corresponding to FIG. 4;
FIG. 6B is a graph showing an I-V curve.

Figure 11A:
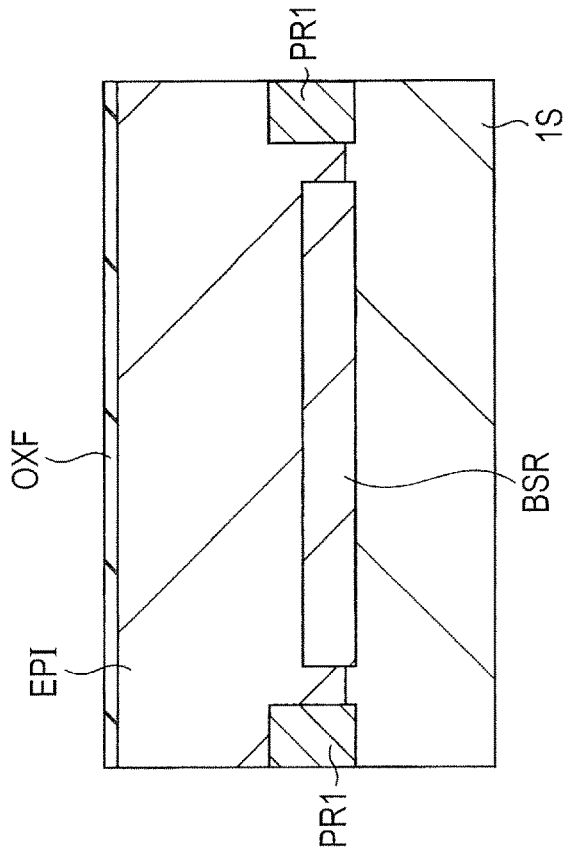
Figure 11B:
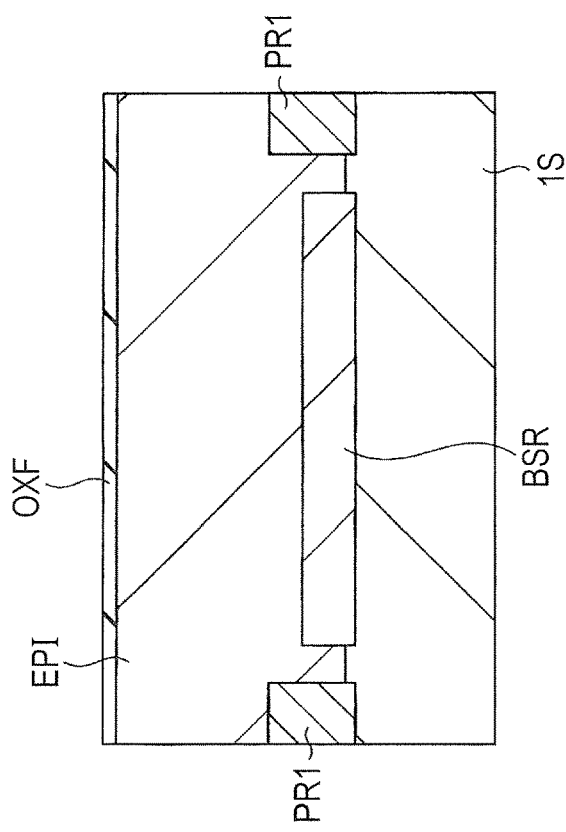
Figure 12A:
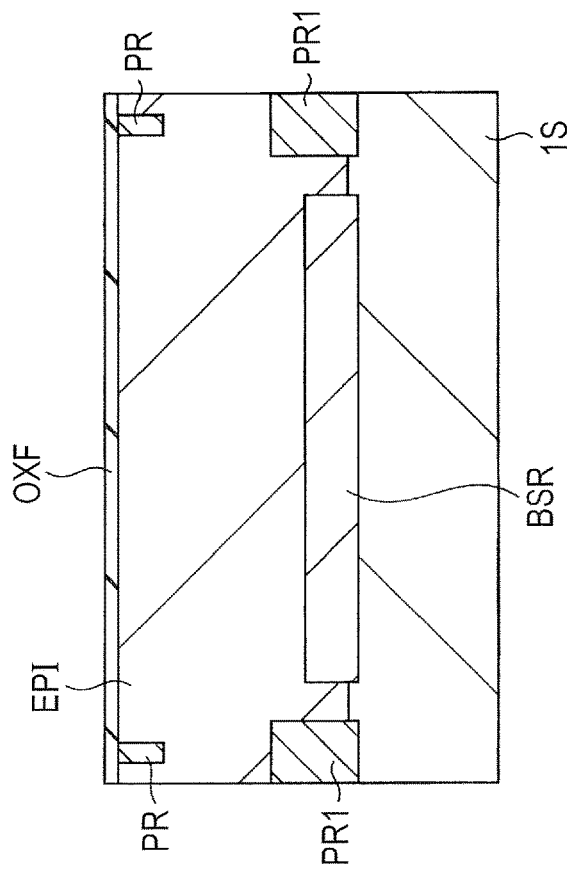
Figure 12B:
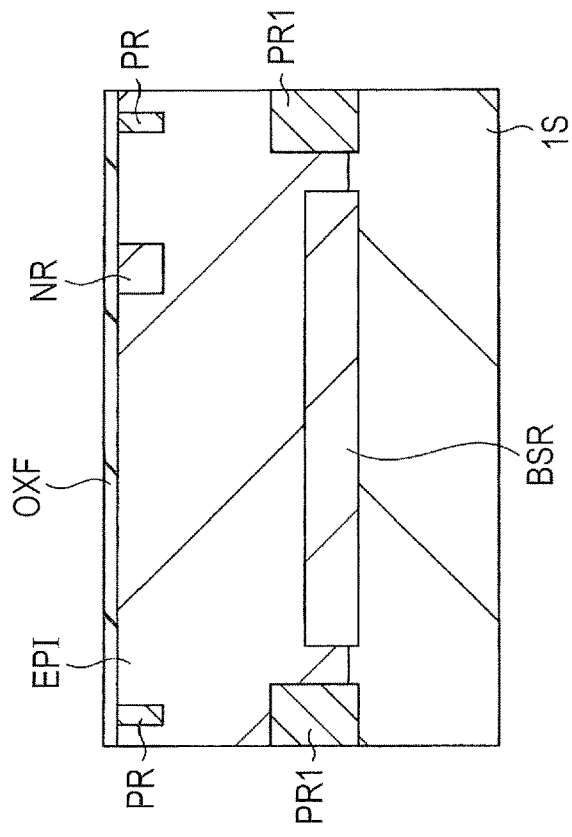
Figure 13A:
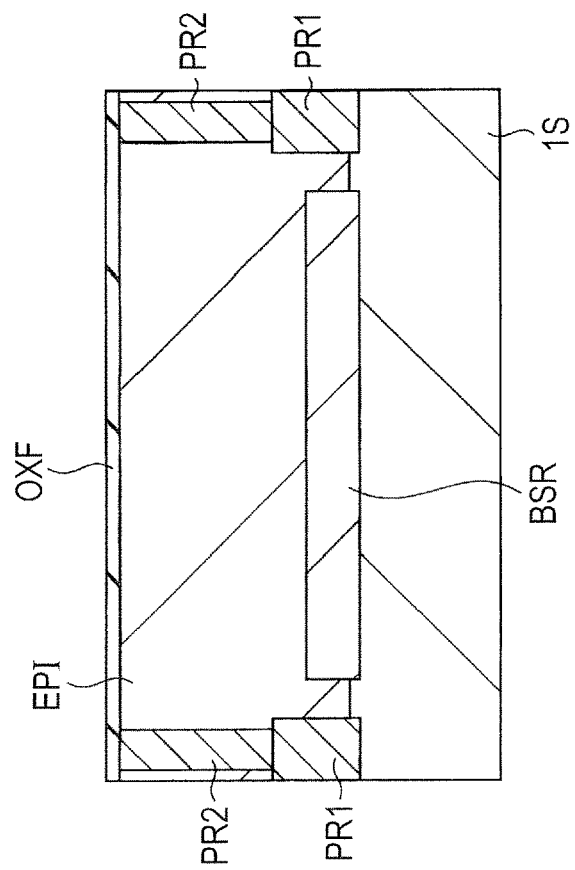
Figure 13B:
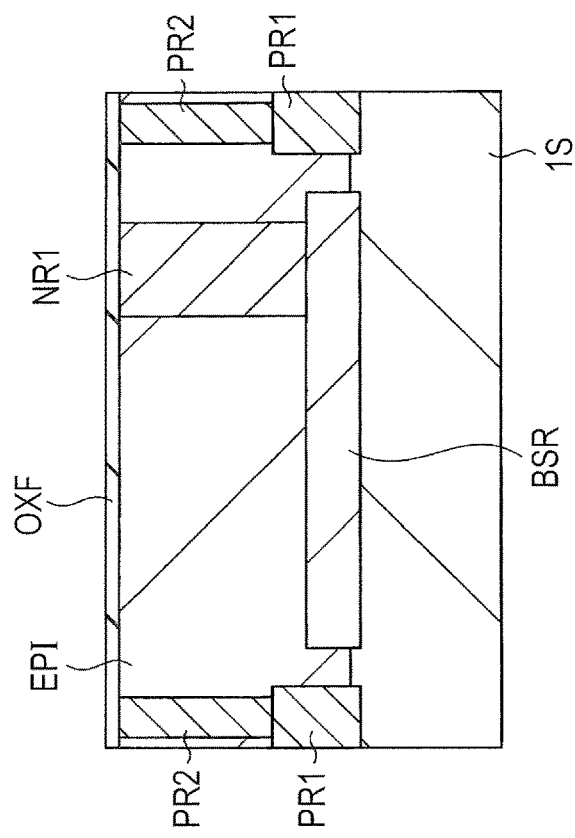
Figure 14A:
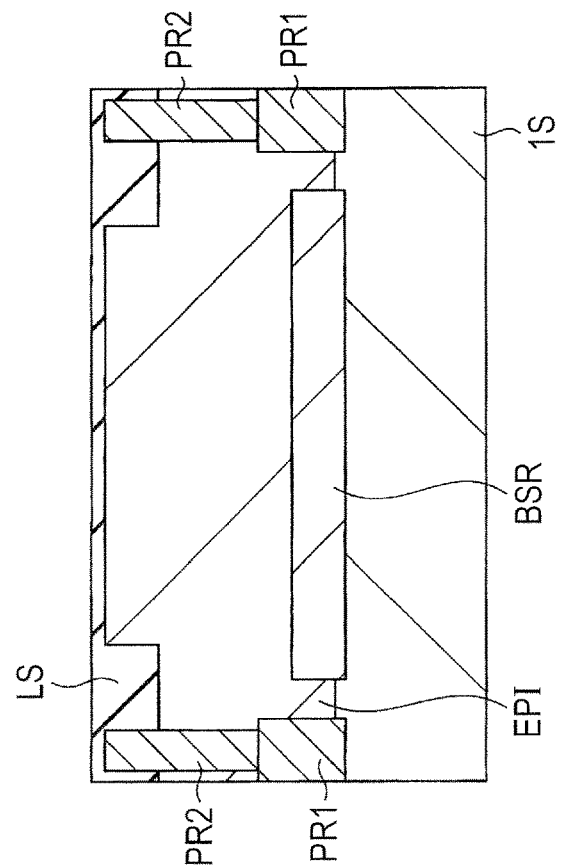
Figure 14B:
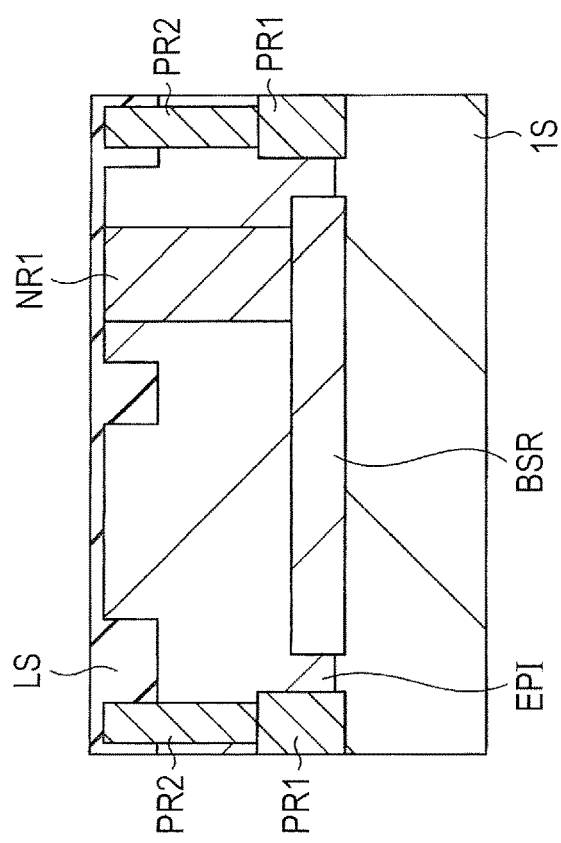
Figure 15A:
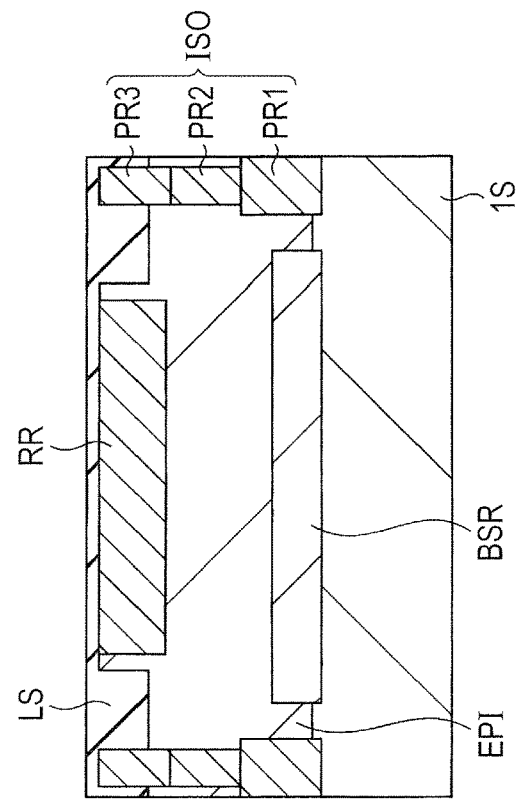
Figure 15B:
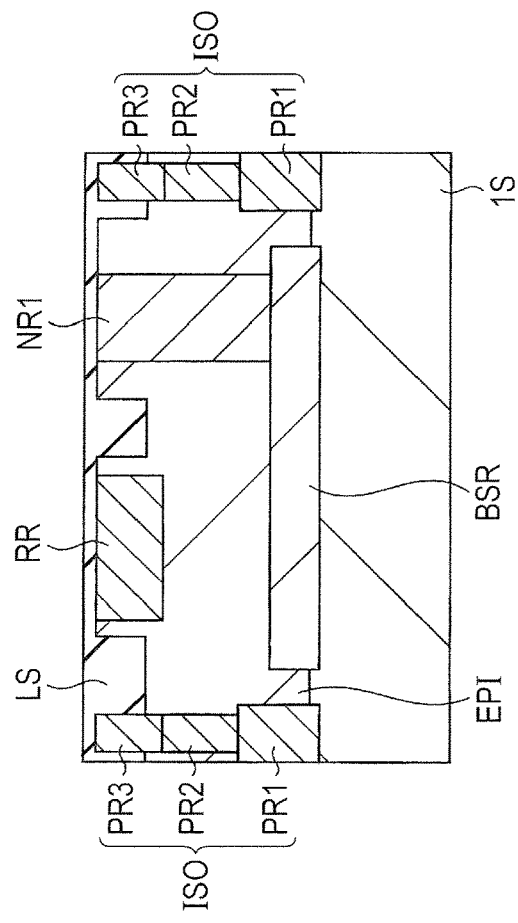
Figure 16A:
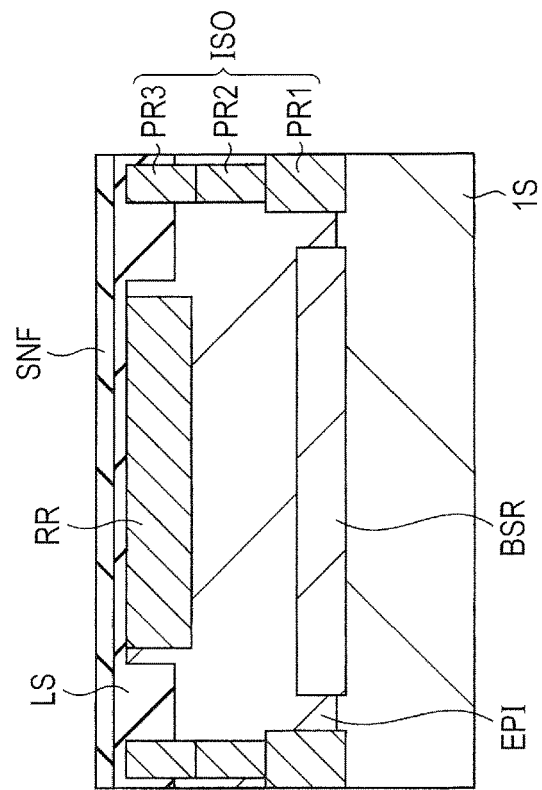
Figure 16B:
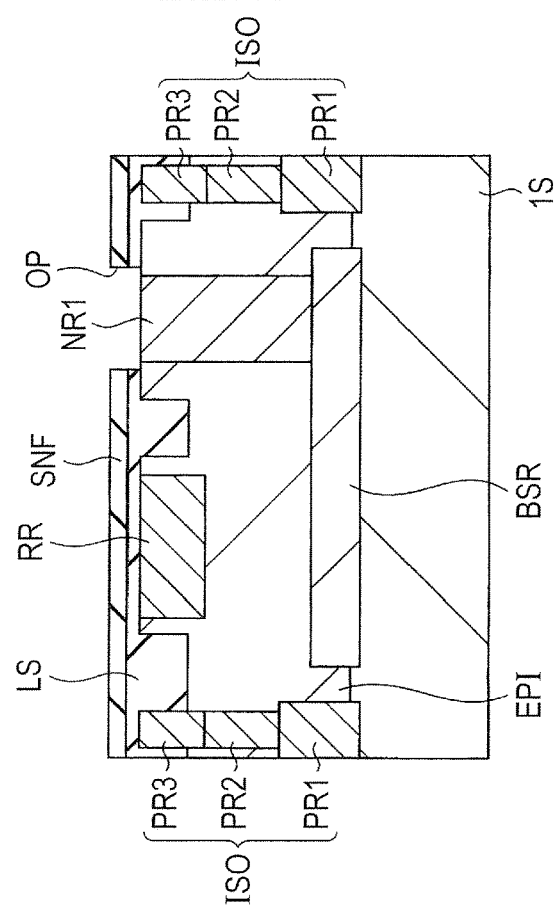
Figure 17A:
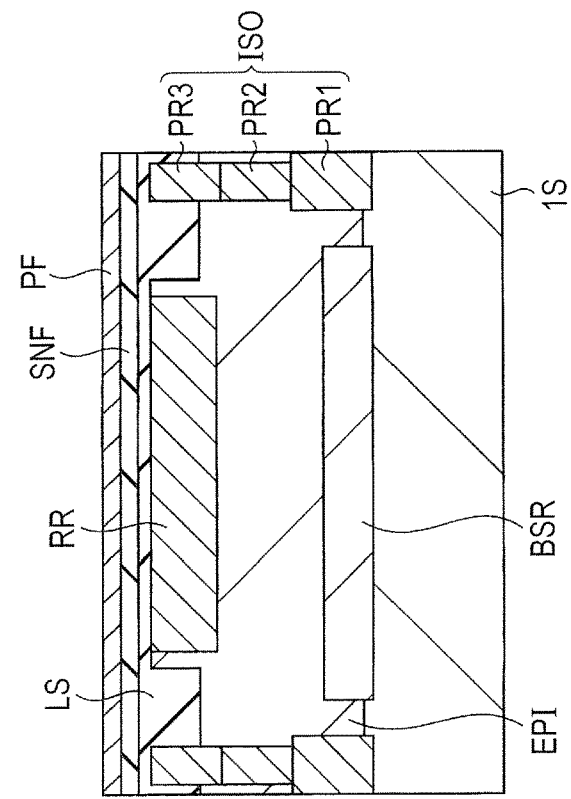
Figure 17B:
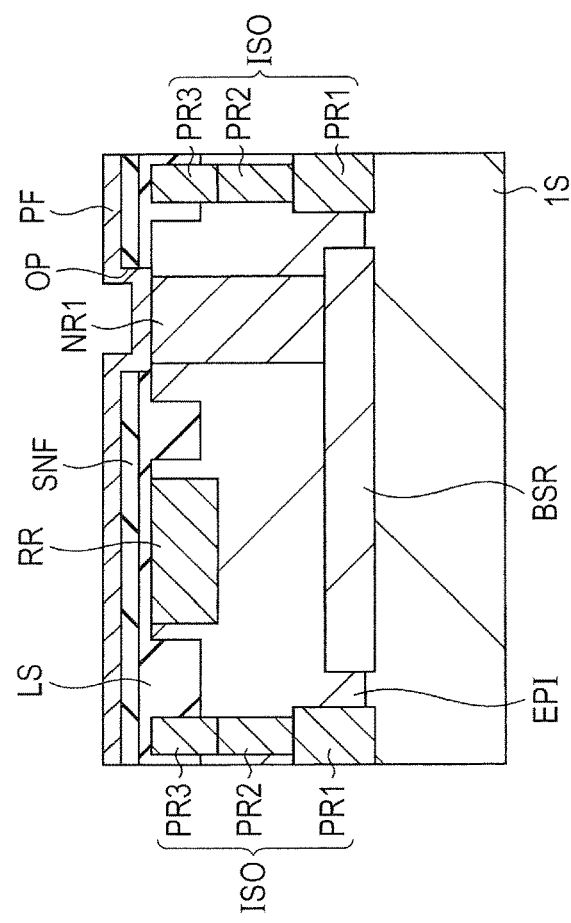
Figures 21A, 21B:
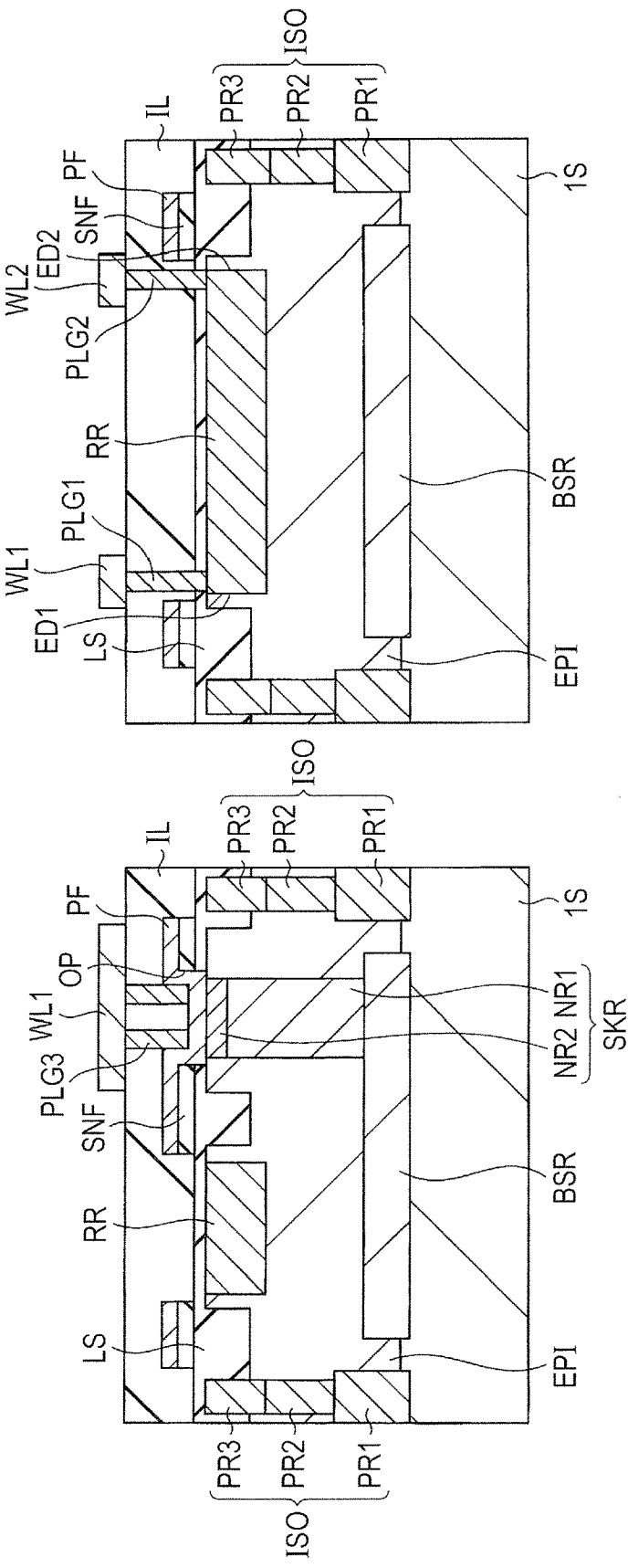
Figure 22:
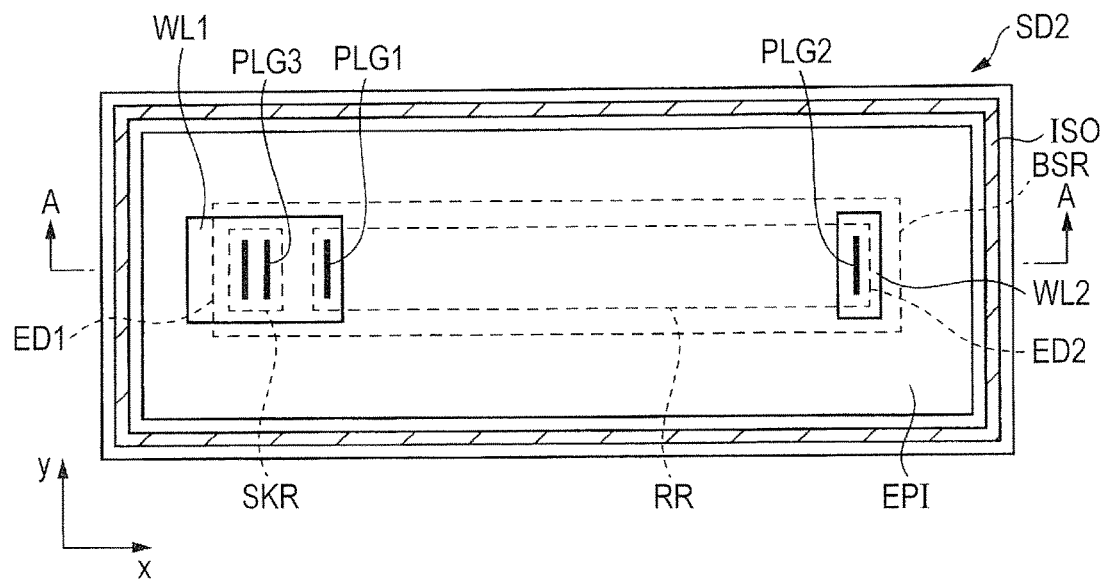
Figure 23:
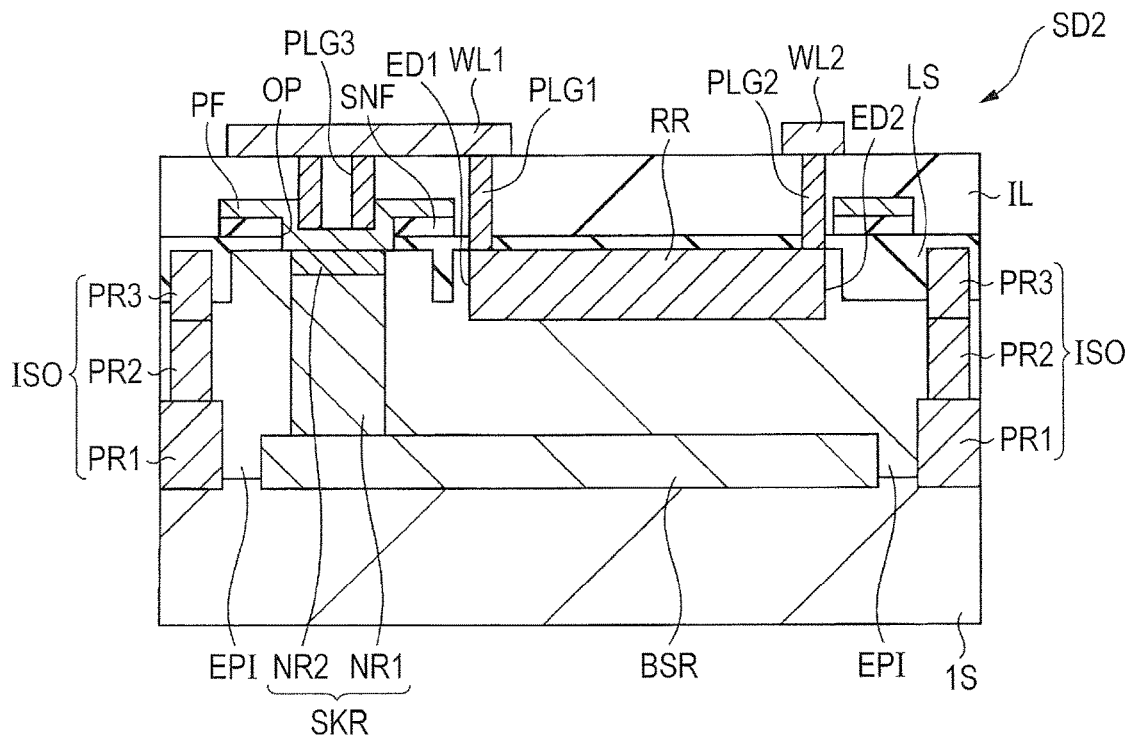
Figure 24:
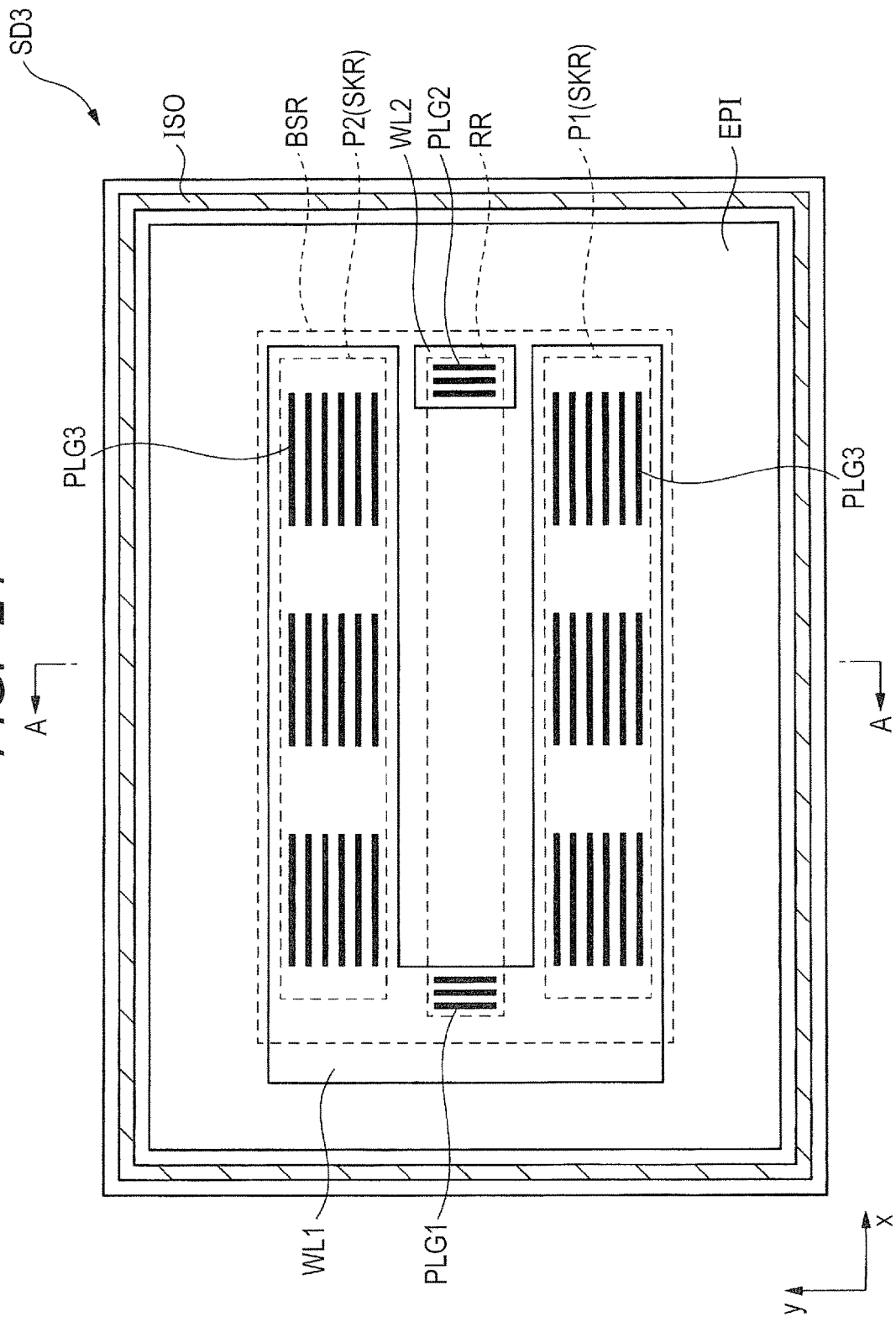
Figure 25:
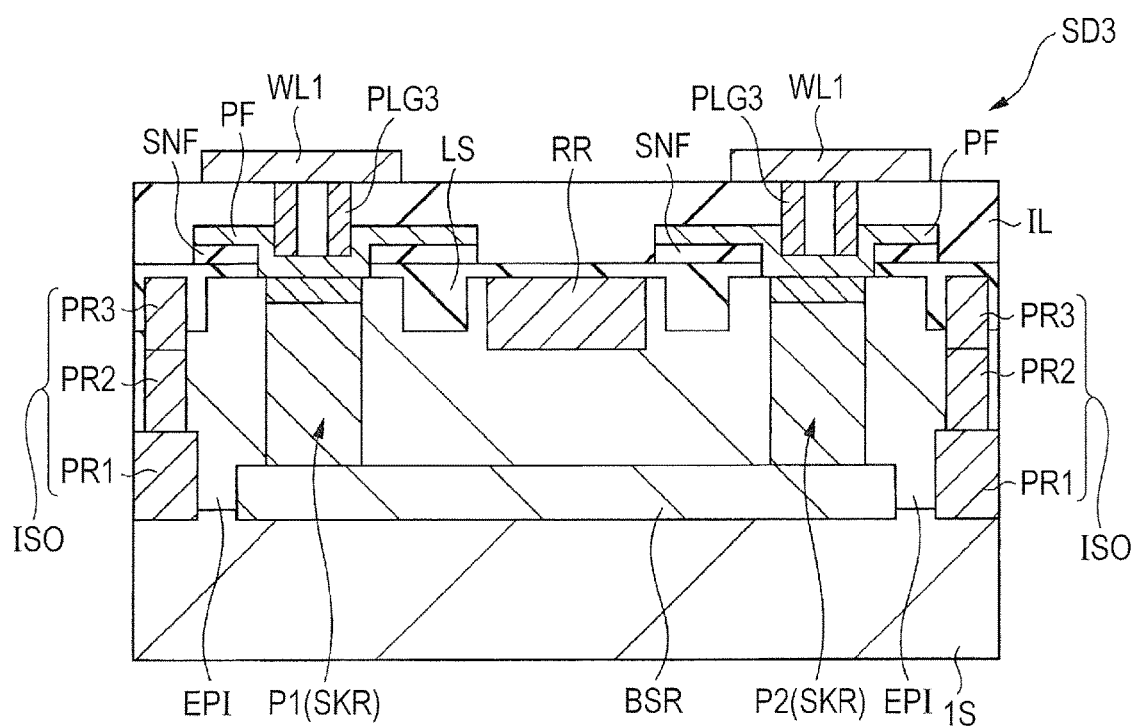

Each of FIGS. 11A and 11B is a sectional view illustrating a manufacturing step of a semiconductor device of the embodiment;

FIG. 12A is a sectional view illustrating a manufacturing step of a semiconductor device following FIG. 11A;
FIG. 12B is a sectional view illustrating a manufacturing step of a semiconductor device following FIG. 11B;
FIG. 13A is a sectional view illustrating a manufacturing step of a semiconductor device following FIG. 12A;
FIG. 13B is a sectional view illustrating a manufacturing step of a semiconductor device following FIG. 12B;
FIG. 14A is a sectional view illustrating a manufacturing step of a semiconductor device following FIG. 13A;
FIG. 14B is a sectional view illustrating a manufacturing step of a semiconductor device following FIG. 13B;
FIG. 15A is a sectional view illustrating a manufacturing step of a semiconductor device following FIG. 14A;
FIG. 15B is a sectional view illustrating a manufacturing step of a semiconductor device following FIG. 14B;
FIG. 16A is a sectional view illustrating a manufacturing step of a semiconductor device following FIG. 15A;
FIG. 16B is a sectional view illustrating a manufacturing step of a semiconductor device following FIG. 15B;
FIG. 17A is a sectional view illustrating a manufacturing step of a semiconductor device following FIG. 16A;
FIG. 17B is a sectional view illustrating a manufacturing step of a semiconductor device following FIG. 16B;
FIG. 18A is a sectional view illustrating a manufacturing step of a semiconductor device following FIG. 17A;
FIG. 18B is a sectional view illustrating a manufacturing step of a semiconductor device following FIG. 17B;
FIG. 19A is a sectional view illustrating a manufacturing step of a semiconductor device following FIG. 18A;
FIG. 19B is a sectional view illustrating a manufacturing step of a semiconductor device following FIG. 18B;
FIG. 20A is a sectional view illustrating a manufacturing step of a semiconductor device following FIG. 19A;
FIG. 20B is a sectional view illustrating a manufacturing step of a semiconductor device following FIG. 19B;
FIG. 21A is a sectional view illustrating a manufacturing step of a semiconductor device following FIG. 20A;
FIG. 21B is a sectional view illustrating a manufacturing step of a semiconductor device following FIG. 20B;
FIG. 22 is a plan view illustrating a planar device structure of a semiconductor element of First Variation;

FIG. 23 is a sectional view, taken along the line A-A in FIG. 22;

FIG. 24 is a plan view illustrating a planar device structure of a semiconductor element of Second Variation;

FIG. 25 is a sectional view, taken along the line A-A in FIG. 24; and

Figure 26:
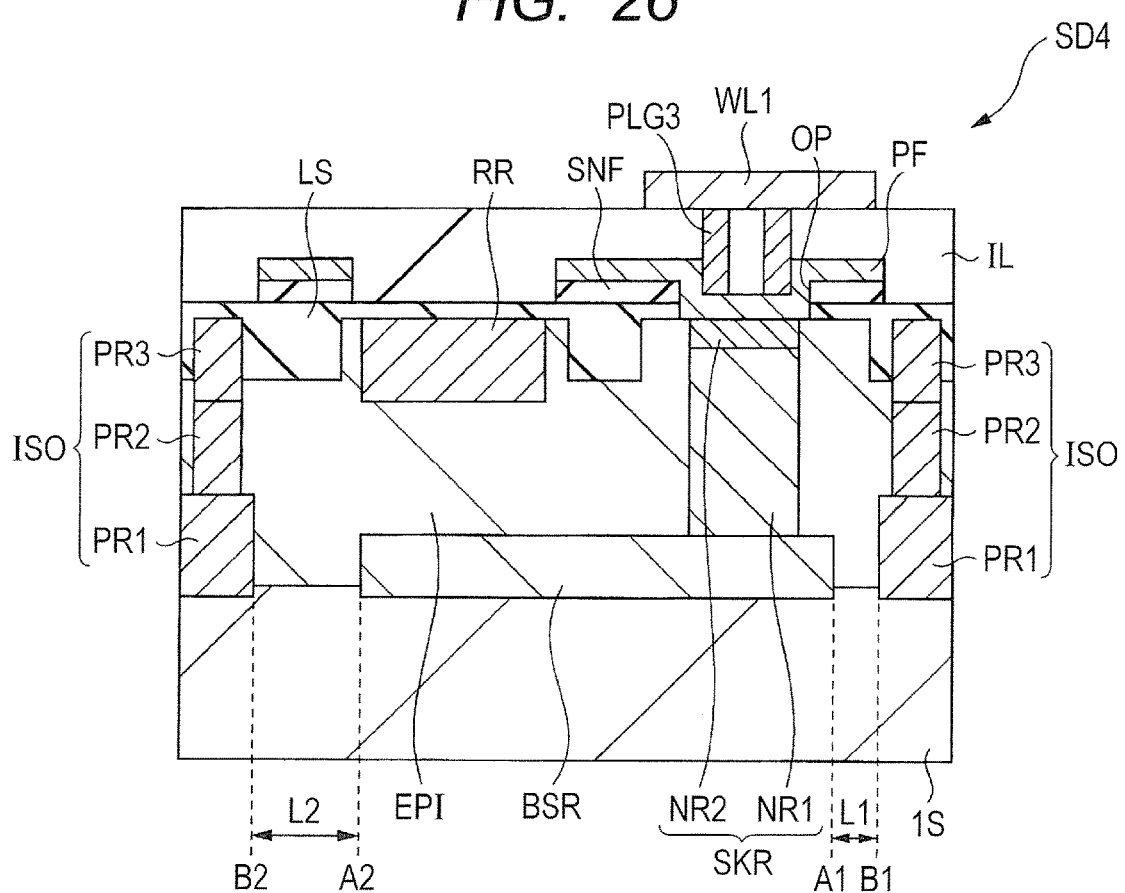

FIG. 26 is a sectional view illustrating a sectional device structure of a semiconductor element of Third Variation.

DETAILED DESCRIPTION

When necessary for convenience in the following embodiments, description is given by dividing the embodiment into a plurality of sections or embodiments; however, unless otherwise indicated, they are not independent of one another, but one is related with part or the whole of another as a variation, a detail, supplementary description, etc.

When the numbers of elements, etc. (including numbers of pieces, numerical values, amounts, ranges, etc.) are referred to in the following embodiments, the numbers are not limited to the specific ones but may be more or less than the specific numbers, unless otherwise indicated or except when the numbers are obviously limited to the specific numbers in principle.

Further, in the following embodiments, it is needless to say that components (also including constituent steps, etc.) are not necessarily requisite unless indicated explicitly or except when they are obviously requisite in principle.

Similarly, when referring to the shapes and positional relations, etc., of components, etc., in the following embodiments, unless indicated explicitly or except when they can be thought otherwise in principle, those substantially the same or similar to the shapes, etc., are to be included. This also applies to the above numerical values and ranges.

In addition, like components are denoted with like reference numerals in principle in each of the views for explaining embodiments, and duplicate descriptions are omitted. For easy understanding of drawings, hatching lines may be drawn even in a plan view.

<Consideration for Improvement>

The "related technique" referred to in the present specification is not a known related art, but a technique having a problem newly discovered by the present inventors, in which a premise technique (unknown technique) of a novel technical idea is intended to be described.

Figure 1:
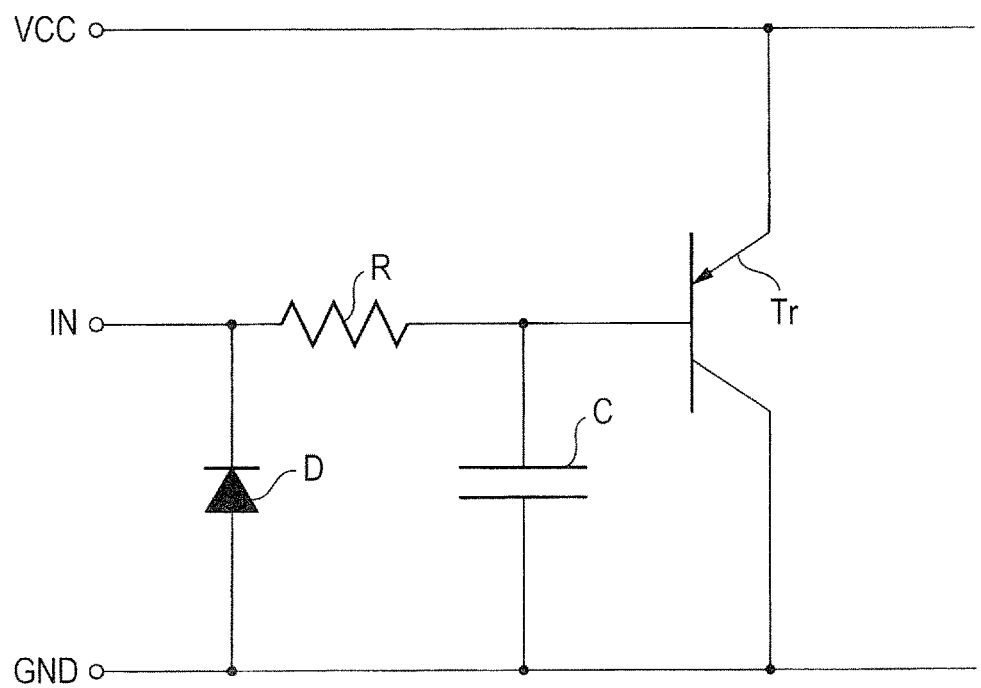
FIG. 1 is a view illustrating an example of a circuit configuration in a related technique.

FIG. 1 is a view illustrating an example of a circuit configuration in the related technique. In FIG. 1, for example, a circuit in the related technique has a power supply terminal VCC to which a power supply potential is supplied, a ground terminal GND to which a reference potential (GND potential) is supplied, and an input terminal IN to which a signal is input. In the circuit in the related technique, an input transistor Tr is electrically coupled between the power supply terminal VCC and the ground terminal GND, as illustrated in FIG. 1. Specifically, for example, the input transistor Tr is comprised of a PNP bipolar transistor, the emitter of the input transistor Tr is electrically coupled to the power supply terminal VCC, and the collector of the input transistor Tr is electrically coupled to the ground terminal GND. On the other hand, the base of the input transistor Tr is electrically coupled to the input terminal IN.

In this case, a low-pass filter including a resistance element R and a capacitive element C is coupled between the base of the input transistor Tr and the input terminal IN in the related technique, as illustrated in FIG. 1. Thereby, in the related technique, high frequency noise, which is included in a signal input from the input terminal IN, can be suppressed from being input to the base of the input transistor Tr.

Further, in the related technique, a diode D functioning as an electrostatic protection element is provided in order to prevent breakdown of the input transistor Tr caused with a surge charge, occurring due to static electricity, applied to the input terminal IN. Specifically, the anode of the diode D is electrically coupled to the input terminal IN, and the cathode thereof is electrically coupled to the ground terminal GND.

Thereby, for example, when a positive surge charge enters the input terminal IN, a reverse voltage is applied to the diode D coupled between the input terminal IN and the ground terminal GND. When the reverse voltage exceeds the breakdown voltage of the diode D, a reverse current flows through the diode D, so that a positive surge charge entering the input terminal IN flows into the ground terminal GND.

Herein, when a reverse current flows through the diode D, an almost constant voltage is applied to both the ends of the diode D. Therefore, even when a positive surge charge enters the input terminal IN, only an almost constant voltage is applied between the input terminal IN and the ground terminal GND because a reverse current flows through the diode D. Thereby, a large voltage caused by a positive surge charge is suppressed from being applied to the input transistor Tr, and as a result, electrostatic breakdown of the input transistor Tr can be prevented.

Thus, in the related technique, the reliability of the circuit in the related technique can be improved by providing both a low-pass filter having a function of removing high-frequency noise and the diode D having a function of preventing electrostatic breakdown caused by a surge charge.

In the related technique, however, a dedicated electrostatic protection element (diode D), which is not related to the original operation of a circuit formed in a semiconductor device, is provided. In this case, the miniaturization of the semiconductor device is hindered. From this, there is room for improvement in the related technique from the viewpoint of improving the electrostatic breakdown tolerance of a semiconductor device without sacrificing the miniaturization of the semiconductor device.

Therefore, a contrivance is made in the present embodiment such that the electrostatic breakdown tolerance of a semiconductor device is improved without sacrificing the miniaturization thereof. Hereinafter, the technical idea of the embodiment, in which this contrivance is made, will be described.

<Basic Idea of Embodiment>

The basic idea of the present embodiment is that the function of an electrostatic protection element is added to another semiconductor element having another function without providing a dedicated electrostatic protection element. That is, the basic idea of the embodiment is that a function as an electrostatic protection element is also added to a semiconductor element having another function. Thereby, there is no need to provide a dedicated electrostatic protection element according to the basic idea of the embodiment, so that the electrostatic breakdown tolerance of a semiconductor device can be improved and the miniaturization thereof can be achieved as well.

In the present embodiment, the above basic idea is achieved particularly by forming a semiconductor element having a device structure in which a parasitic bipolar transistor having an electrostatic protection function is added to a resistance element having a function different from an electrostatic protection function. Hereinafter, a semiconductor element of the embodiment embodying this basic idea will be described.

<Circuit Configuration of Semiconductor Element>

Figure 2:
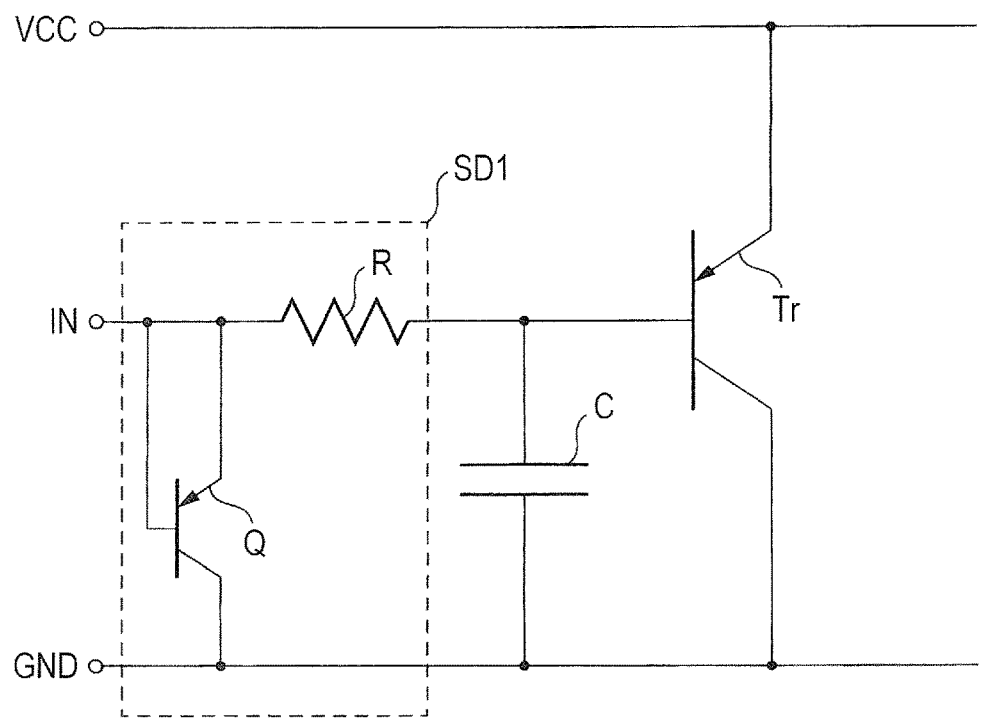
FIG. 2 is a view illustrating an example of a circuit configuration including a semiconductor element of an embodiment.

FIG. 2 is a view illustrating an example of a circuit configuration including a semiconductor element of the present embodiment. As illustrated in FIG. 2, a circuit of the embodiment has a power supply terminal VCC to which a power supply potential is supplied, a ground terminal GND to which a reference potential is supplied, and an input terminal IN to which a signal is input. In the circuit of the embodiment, an input transistor Tr is electrically coupled between the power supply terminal VCC and the ground terminal GND, as illustrated in FIG. 2. Specifically, for example, the input transistor Tr is comprised of a PNP bipolar transistor, the emitter of the input transistor Tr is electrically coupled to the power supply terminal VCC, and the collector of the input transistor Tr is electrically coupled to the ground terminal GND. On the other hand, the base of the input transistor Tr is electrically coupled to the input terminal IN.

In this case, a low-pass filter including a resistance element R and a capacitive element C is coupled between the base of the input transistor Tr and the input terminal IN in the present embodiment, as illustrated in FIG. 2. Thereby, also in the embodiment, high frequency noise, which is included in a signal input from the input terminal IN, can be suppressed from being input to the base of the input transistor Tr.

In the present embodiment, a semiconductor element SD1 having a device structure, in which a parasitic bipolar transistor Q having an electrostatic protection function is added to a resistance element R having a function different from an electrostatic protection function, is provided. That is, the semiconductor element SD1 of the embodiment has a function as the resistance element R that forms a low-pass filter and includes the parasitic bipolar transistor Q functioning as an electrostatic protection element. Thereby, there is no need to provide a dedicated electrostatic protection element according to the embodiment, and hence the electrostatic breakdown tolerance of a semiconductor device can be improved, and the miniaturization thereof can be achieved as well.

<Planar Device Structure of Semiconductor Element>

Figure 3:
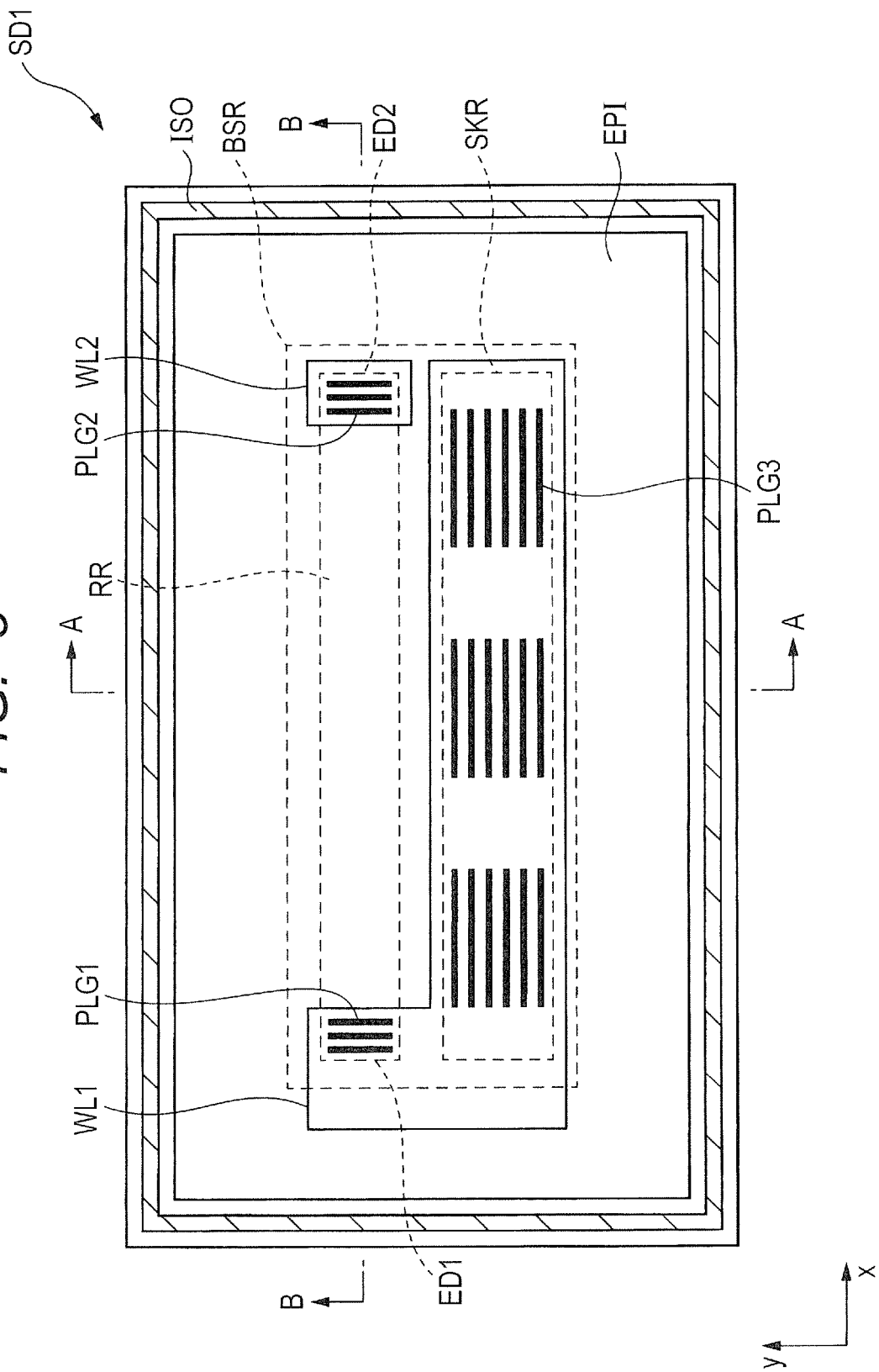
FIG. 3 is a plan view illustrating a planar device structure of the semiconductor element of the embodiment.

Next, the planar device structure of a semiconductor element of the present embodiment will be described. FIG. 3 is a plan view illustrating a planar device structure of the semiconductor element SD1 of the embodiment. As illustrated in FIG. 3, the semiconductor element SD1 of the embodiment is formed in an epitaxial layer EPI surrounded by an isolated semiconductor region ISO including a p-type semiconductor region. The epitaxial layer EPI is formed from an n-type semiconductor layer, and a buried semiconductor region BSR including an n-type semiconductor region is formed in the epitaxial layer EPI. In plan view, a resistance region RR and a sinker region SKR are formed so as to be included in the buried semiconductor region BSR. Specifically, the resistance region RR is formed from a p-type semiconductor region, whereas the sinker region SKR is formed from an n-type semiconductor region. The resistance region RR is formed so as to extend in the x direction, and the sinker region SKR is formed so as to extend in the x direction while being spaced apart from the resistance region RR. That is, the resistance region RR and the sinker region SKR extend in parallel in the x direction while being spaced apart from each other in the y direction.

One end portion ED1 of the resistance region RR is electrically coupled to a plurality of plugs PLG1, and is coupled to a wiring WL1 via these plugs PLG 1. On the other hand, the other end portion ED2 of the resistance region RR is electrically coupled to a plurality of plugs PLG2, and is coupled to a wiring WL2 via these plugs PLG2. The sinker region SKR is electrically coupled to a plurality of plugs PLG3, and is coupled to the wiring WL1 via these plugs PLG3. Therefore, the resistance region RR and the sinker region SKR are electrically coupled to each other by the wiring WL1.

Herein, the wiring WL1 is electrically coupled to the input terminal IN illustrated, for example, in FIG. 2, and hence the one end portion of the resistance region RR is electrically coupled to the input terminal IN. Because the sinker region SKR is also electrically coupled to the wiring WL1, the sinker region SKR is also electrically coupled to the input terminal IN.

On the other hand, the wiring WL2 is electrically coupled to the capacitive element C and the base of the input transistor Tr illustrated, for example, in FIG. 2, and hence the other end portion of the resistance region RR is electrically coupled to the base of the input transistor Tr by the wiring WL2.

<Sectional Device Structure of Semiconductor Element>

Figure 4:
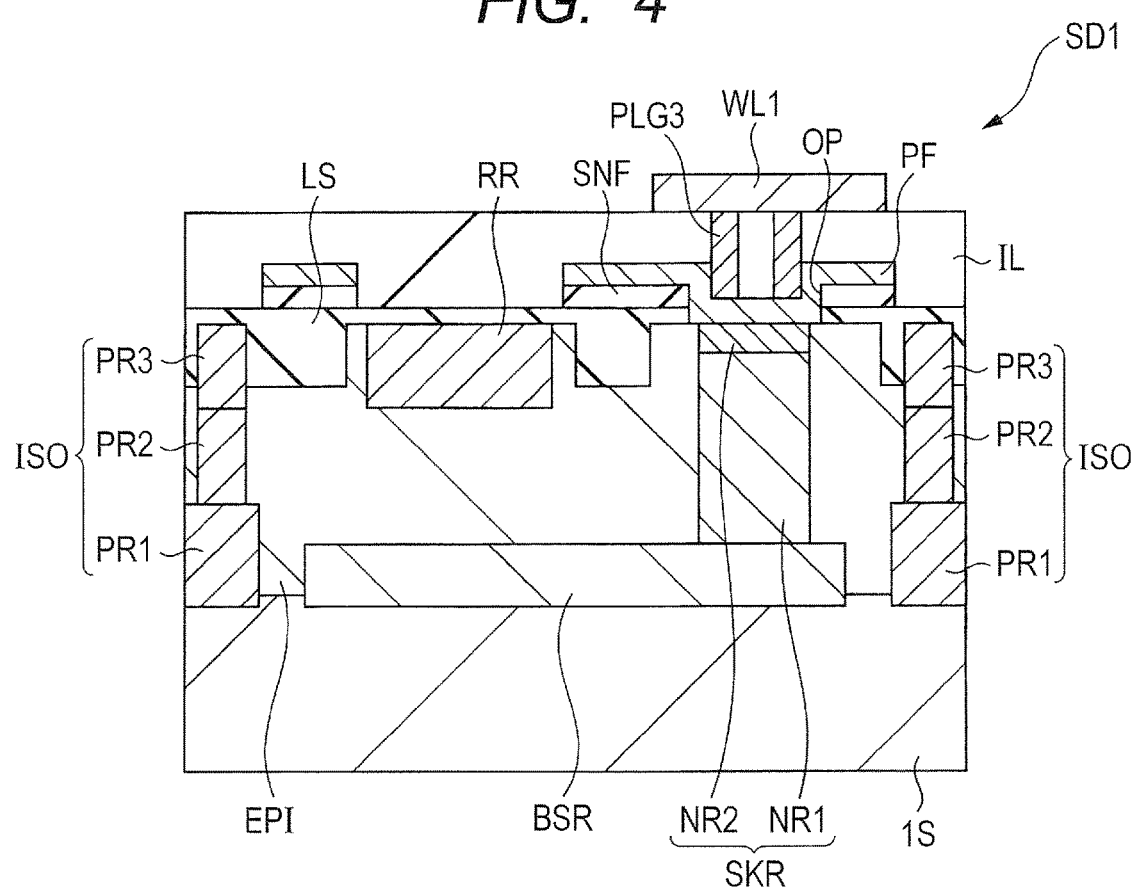
FIG. 4 is a sectional view, taken along the line A-A in FIG. 3.

Subsequently, the sectional device structure of a semiconductor element of the present embodiment will be described. FIG. 4 is a sectional view, taken along the line A-A in FIG. 3. As illustrated in FIG. 4, the semiconductor element SD1 of the embodiment has a p-type semiconductor substrate 1S, over which the epitaxial layer EPI including an n-type semiconductor layer is formed.

The buried semiconductor region BSR, which is an n-type semiconductor region having a higher impurity concentration than the epitaxial layer EPI, is formed across the boundary between the semiconductor substrate 1S and the epitaxial layer EPI. As illustrated in FIG. 4, the isolated semiconductor region ISO, including a p-type semiconductor region in contact with the semiconductor substrate 1S, is further formed to be spaced apart from the buried semiconductor region BSR. The isolated semiconductor region ISO is comprised of, for example: a p-type semiconductor region PR1 in contact with the semiconductor substrate 1S; a p-type semiconductor region PR2 formed over the p-type semiconductor region PR1; and a p-type semiconductor region PR3 having a higher impurity concentration than the p-type semiconductor region PR2.

The isolated semiconductor region ISO thus configured is electrically coupled to the ground terminal GND illustrated in FIG. 2, although not illustrated in FIG. 4. Therefore, the semiconductor substrate 1S in contact with the isolated semiconductor region ISO is also electrically coupled to the ground terminal GND. From this, a stable ground potential can be supplied to the semiconductor substrate 1S by electrically coupling the semiconductor substrate 1S to the isolated semiconductor region ISO. That is, the isolated semiconductor region ISO has a function of electrically isolating the semiconductor element SD1 from other semiconductor elements formed in the epitaxial layer EPI, and has a function of supplying a stable ground potential to the semiconductor substrate 1S.

Next, an isolation insulating film (LOCOS) LS, including a silicon oxide film formed by, for example, a selective oxidation process, is formed over the surface of the epitaxial layer EPI, and the resistance region RR functioning as a resistance element is formed in the surface of the epitaxial layer EPI interposed between the isolation insulating films LS, as illustrated in FIG. 4. This resistance region RR is comprised of, for example, a p-type semiconductor region. And, the sinker region SKR is formed as illustrated in FIG. 4, the sinker region SKR being in contact with the buried semiconductor region BSR, reaching the surface of the epitaxial layer EPI, and including an n-type semiconductor region having a higher impurity concentration than the epitaxial layer EPI. This sinker region SKR is comprised of, for example, an n-type semiconductor region NR1 in contact with the buried semiconductor region BSR, and an n-type semiconductor region NR2 having a higher impurity concentration than the n-type semiconductor region NR1.

Subsequently, a silicon nitride film. SNF is partially formed over the isolation insulating film LS, and a polysilicon film PF is formed over the silicon nitride film SNF, as illustrated in FIG. 4. In particular, an opening OP penetrating the isolation insulating film LS and the silicon nitride film SNF is formed at a position planarly overlapping the sinker region SKR, and the polysilicon film PF is buried in the opening OP. That is, the sinker region SKR is exposed from the opening OP, and the polysilicon film PF is formed in the opening OP so as to contact the exposed sinker region SKR.

As illustrated in FIG. 4, an interlayer insulating film IL including, for example, a silicon oxide film is formed above the epitaxial layer EPI so as to cover the surfaces of the polysilicon film PF and the isolation insulating film LS. The plug PLG 3, penetrating the interlayer insulating film IL to reach the polysilicon film PF, is formed in the interlayer insulating film IL. Further, the wiring WL1, which is to be electrically coupled to the plug PLG3, is formed over the interlayer insulating film IL. Therefore, the buried semiconductor region BSR, the sinker region SKR, the polysilicon film PF, the plug PLG3, and the wiring WL1 are electrically coupled to each other, as illustrated in FIG. 4.

Figure 5:
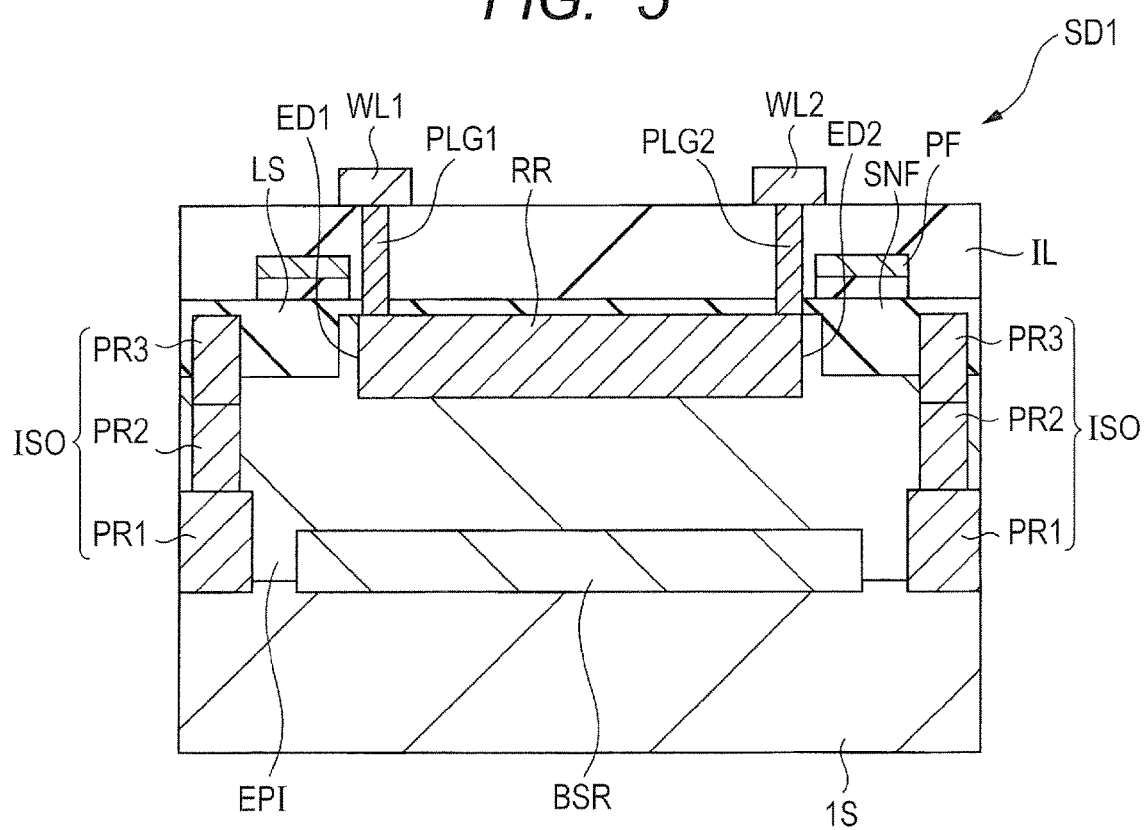
FIG. 5 is a sectional view, taken along the line B-B in FIG. 3.

Next, FIG. 5 is a sectional view, taken along the line B-B in FIG. 3. As illustrated in FIG. 5, the semiconductor element SD1 of the present embodiment has the semiconductor substrate 1S and the epitaxial layer EPI formed over the semiconductor substrate 1S. The isolated semiconductor region ISO is formed in the epitaxial layer EPI, and the buried semiconductor region BSR is formed at a position interposed between the isolated semiconductor regions ISO. The isolation insulating film LS is formed over the surface of the epitaxial layer EPI, and the resistance region RR is formed in the surface of the epitaxial layer EPI interposed between the isolation insulating films LS. Further, the interlayer insulating film IL is formed above the epitaxial layer EPI, and the plug PLG1 and the plug PLG2, both penetrating the interlayer insulating film IL to reach the resistance region RR, are formed in the interlayer insulating film IL. That is, the plug PLG1, which is to be electrically coupled to the one end portion ED1 of the resistance region RR, and the plug PLG2, which is to be electrically coupled to the other end portion ED2 of the resistance region RR, are formed in the interlayer insulating film IL. The wiring WL1, which is to be electrically coupled to the plug PLG1, and the wiring WL2, which is to be electrically coupled to the plug PLG2, are formed over the interlayer insulating film IL.

From the above description, the buried semiconductor region BSR, the sinker region SKR, the polysilicon film PF, the plug PLG3, and the wiring WL1 are electrically coupled to each other, as illustrated, for example, in FIG. 4; and the one end portion ED1 of the resistance region RR and the wiring WL1 are electrically coupled to each other, as illustrated, for example, in FIG. 5. Therefore, the one end portion ED1 of the resistance region RR, the buried semiconductor region BSR, the sinker region SKR, the polysilicon film PF, the plug PLG3, and the wiring WL1 are electrically coupled to each other.

As illustrated in FIGS. 4 and 5, the distance (first distance) between the one end portion (left end portion) ED1 of the buried semiconductor region BSR and the isolated semiconductor region ISO on the left side and the distance (second distance) between the other end portion (right end portion) ED2 of the buried semiconductor region BSR and the isolated semiconductor region ISO on the right side are equal to each other in section view.

The semiconductor element SD1 thus configured has a function as a resistance element and a function as an electrostatic protection element. Specifically, in the semiconductor element SD1 of the present embodiment, a resistance element is comprised of the resistance region RR, while an electrostatic protection element is comprised of a parasitic bipolar transistor having the resistance region RR as an emitter, the epitaxial layer EPI and the buried semiconductor region BSR as a base, and the semiconductor substrate 1S as a collector.

That is, the semiconductor element SD1 of the present embodiment includes the semiconductor substrate 1S, the epitaxial layer EPI formed over the semiconductor substrate 1S, the resistance region RR (resistance element) formed in the epitaxial layer EPI, and an electrostatic protection element formed of a bipolar transistor having the resistance region RR as a component, as illustrated, for example, in FIG. 4.

In this case, the semiconductor element SD1 of the present embodiment has the buried semiconductor region BSR, the semiconductor region BSR being formed in the epitaxial layer EPI, having a higher impurity concentration than the epitaxial layer EPI, being electrically coupled to the resistance region RR, and having a conductivity type opposite to that of the resistance region RR.

The bipolar transistor serving as an electrostatic protection element is comprised of the resistance region RR functioning as an emitter, the buried semiconductor region functioning as a base, and the semiconductor substrate 1S functioning as a collector.

Herein, the semiconductor element SD1 of the present embodiment has the isolated semiconductor region ISO, as illustrated, for example, in FIG. 4, the isolated semiconductor region ISO surrounding the buried semiconductor region BSR in plan view, being electrically coupled to the semiconductor substrate 1S, and having the same conductivity type as that of the semiconductor substrate 1S.

<Specific Design Numerical Examples>

Next, specific design numerical examples will be described. In FIG. 4, the resistance region RR is comprised of a p-type semiconductor region, and the impurity concentration of the resistance region RR is, for example, approximately $1 \times 10^{19}$ (atoms/cm$^3$), but not limited thereto, it may be within the range of $1 \times 10^{17}$ (atoms/cm$^3$) to $1 \times 10^{21}$ (atoms/cm$^3$).

The epitaxial layer EPI is comprised of an n-type semiconductor layer. The thickness of the epitaxial layer EPI is, for example, 10 μm, and the impurity concentration thereof is, for example, approximately $1 \times 10^{15}$ (atoms/cm$^3$). However, not limited thereto, the thickness of the epitaxial layer EPI may be 5 μm to 18 μm, and the impurity concentration thereof may be within the range of $1 \times 10^{14}$ (atoms/cm$^3$) to $1 \times 10^{17}$ (atoms/cm$^3$).

The sinker region SKR is comprised of the n-type semiconductor regions NR1 and NR2, and the impurity concentration of the n-type semiconductor region NR1 is, for example, $5\times10^{16}$ (atoms/cm$^3$), and that of the n-type semiconductor region NR2 is, for example, $1\times10^{20}$ (atoms/cm$^3$). However, not limited thereto, the impurity concentration of the n-type semiconductor region NR1 may be, for example, $5\times10^{15}$ (atoms/cm$^3$), and that of the n-type semiconductor region NR2 may be, for example, $1\times10^{21}$ (atoms/cm$^3$). Herein, the impurity concentration of the sinker region SKR is preferably 10 times or more that of the epitaxial layer EPI.

The buried semiconductor region BSR is comprised of an n-type semiconductor region, and the impurity concentration thereof is, for example, approximately $2\times10^{18}$ (atoms/cm$^3$), but not limited thereto, it may be approximately $1\times10^{20}$ (atoms/cm$^3$).

The isolated semiconductor region ISO is comprised of the p-type semiconductor region PR1, the p-type semiconductor region PR2, and the p-type semiconductor region PR3. The impurity concentration of the p-type semiconductor region PR1 is, for example, approximately $5\times10^{17}$ (atoms/cm$^3$), but not limited thereto, it may be approximately $1\times10^{20}$ (atoms/cm$^3$). The impurity concentration of each of the p-type semiconductor regions PR2 and PR3 is, for example, approximately $1\times10^{19}$ (atoms/cm$^3$), but not limited thereto, it may be approximately $1\times10^{20}$ (atoms/cm$^3$). The isolated semiconductor region ISO has both a function of isolating the resistance element including the resistance region RR from other semiconductor elements and a function of fixing the potential of the semiconductor substrate 1S. Although not illustrated in FIG. 4, the isolated semiconductor region ISO is electrically coupled to a wiring via a plug, and finally is electrically coupled to the ground terminal GND illustrated in FIG. 2.

In FIG. 4, the sinker region SKR is coupled to the wiring WL1 via the polysilicon film PF and the plug PLG3. On the other hand, in FIG. 5, the one end portion (left end portion) ED1 of the resistance region RR is electrically coupled to the wiring WL1 via the plug PLG1, and the other end portion (right end portion) ED2 of the resistance region RR is electrically coupled to the wiring WL2 via the plug PLG2. The wiring WL1 is electrically coupled to the input terminal IN illustrated in FIG. 2, whereas the wiring WL2 is electrically coupled to the base of the input transistor Tr illustrated in FIG. 2.

Herein, each of the plugs PLG1 to PLG3 is comprised of, for example, a tungsten plug, but not limited thereto, it may be comprised of an aluminum plug. Each of the wirings WL1 and WL2 is comprised of, for example, an aluminum wiring.

In FIGS. 4 and 5, the distance between the buried semiconductor region BSR and the p-type semiconductor region PR1 is approximately 1 μm. The reverse junction breakdown voltage between the buried semiconductor region BSR and the p-type semiconductor region PR1 is the lowest, and when a potential difference of 50 V occurs between the buried semiconductor region BSR and the p-type semiconductor region PR1, a leakage current starts flowing between them. The distance between the buried semiconductor region BSR and the p-type semiconductor region PR1 may be within the range of 0 μm to 20 μm. However, it is desirable to design the distance so that the space between the buried semiconductor region BSR and the p-type semiconductor region PR1 first breaks down when a positive surge charge enters the input terminal IN illustrated in FIG. 2, and the reverse junction breakdown voltage needs to be higher than the maximum voltage of product specification and lower than the breakdown voltage of the input transistor TIr illustrated in FIG. 2.

<Operations of Semiconductor Element>

The semiconductor element SD1 of the present embodiment is configured as described above, and operations of the parasitic bipolar transistor that serves as an electrostatic protection element will be described below. Operations of the semiconductor element SD1, particularly in the case where a positive surge charge enters the input terminal IN illustrated in FIG. 2, will be described. The operations will be described by using both a schematic view corresponding to FIG. 4 and an I-V curve obtained when the surge charge is increased in a stepwise manner.

FIG. 6A is a schematic view corresponding to FIG. 4, and FIG. 6B is a graph showing an I-V curve. In FIG. 6B, the horizontal axis of the I-V curve represents the voltage applied to the one end portion ED1 of the resistance region RR illustrated in FIGS. 3 and 5, when a surge charge enters the input terminal IN illustrated in FIG. 2. On the other hand, the vertical axis of the I-V curve represents the current flowing through the one end portion ED1 of the resistance region RR. This I-V curve shows that the larger this current, the more surge charges can be passed to the ground terminal GND illustrated in FIG. 2, that is, the electrostatic breakdown tolerance becomes higher.

First, FIG. 6A is an explanatory view illustrating the case where a potential of 40 V is applied to the one end portion ED1 of the resistance region RR by a surge charge entering the input terminal IN illustrated in FIG. 2. As illustrated in FIG. 6A, a reference potential of 0 V is applied to the isolated semiconductor region ISO and the semiconductor substrate 1S that are electrically coupled to the ground terminal GND illustrated in FIG. 2. On the other hand, a potential of 40 V is applied to the resistance region RR, the sinker region SKR, the buried semiconductor region BSR, and the epitaxial layer EPI that are electrically coupled to the input terminal IN illustrated in FIG. 2. This state corresponds to the point (1) of the I-V curve illustrated in FIG. 6B, and no current flows through the one end portion ED1 of the resistance region RR. In other words, the potential of 40 V is a potential within the range to be applied in the normal operation in terms of product specification, and is a level at which electrostatic breakdown by a surge charge entering the input terminal IN illustrated in FIG. 2 does not occur. From this, a current flowing from the one end portion ED1 of the resistance region RR to the ground terminal GND, which passes a surge charge to the ground terminal GND, does not occur.

Figure 7A:
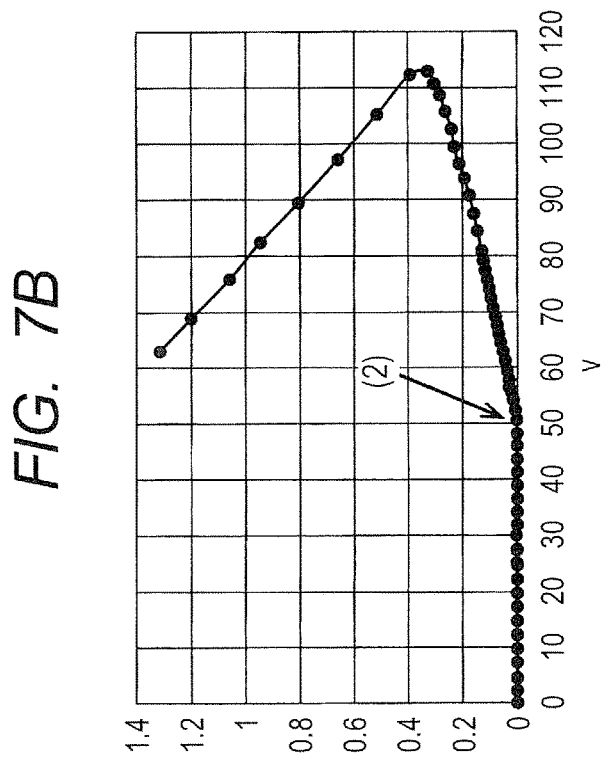
FIG. 7A is a schematic view corresponding to FIG. 4.
Figure 7B:
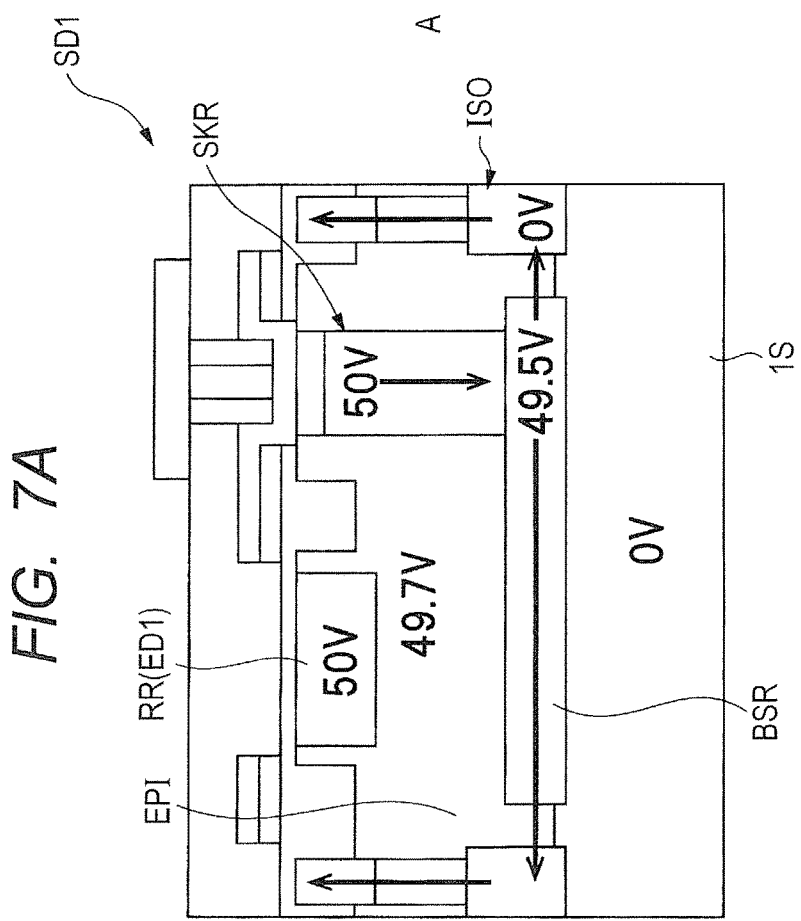
FIG. 7B is a graph showing an I-V curve.

Next, FIG. 7A is a schematic view corresponding to FIG. 4, and FIG. 7B is a graph showing an I-V curve. FIG. 7A is an explanatory view particularly illustrating the case where a potential of 50 V is applied to the one end portion ED1 of the resistance region RR by a surge charge entering the input terminal IN illustrated in FIG. 2. As illustrated in FIG. 7A, the potential of the one end portion ED1 of the resistance region RR is fixed to the potential of 50 V. On the other hand, in the semiconductor element SD1 of the present embodiment, a reverse bias of 50 V is applied between the buried semiconductor region BSR and the isolated semiconductor region ISO, and as a result, a leakage current starts flowing between them. Therefore, a potential drop according to Ohm's law, which is caused by the flow of a leakage current, occurs in the epitaxial layer EPI, the sinker region SKR, and the buried semiconductor region BSR, as illustrated in FIG. 7A. As a result, the potential of the epitaxial layer EPI becomes, for example, approximately 49.7 V and that of the buried semiconductor region BSR becomes, for example, approximately 49.5 V, as illustrated in FIG. 7A. In the state illustrated in FIG. 7A, the potential of the one end portion ED1 of the resistance region RR is fixed to a potential of 50 V, but that of the epitaxial layer EPI in contact with the resistance region RR becomes lower than that of the one end portion ED1 of the resistance region RR, as described above. As a result, a forward bias is applied to the p-n junction between the one end portion ED1 of the resistance region RR and the epitaxial layer EPI, but this forward bias (0.3 V) is lower than the built-in potential (0.7 V) of the p-n junction, and hence no current flows from the one end portion ED1 of the resistance region RR to the epitaxial layer EPI. The state illustrated in FIG. 7A corresponds to the point (2) of the I-V curve illustrated in FIG. 7B.

Figure 8A:
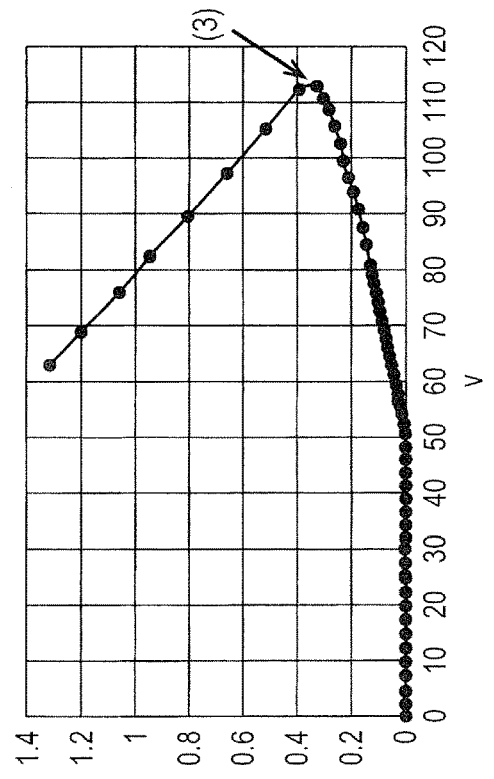
FIG. 8A is a schematic view corresponding to FIG. 4.
Figure 8B:
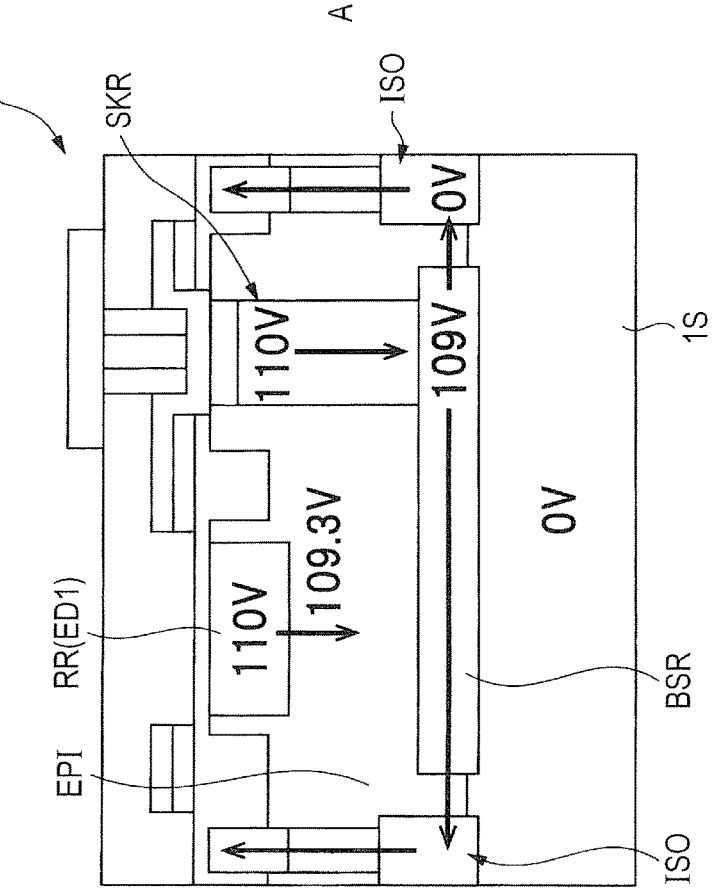
FIG. 8B is a graph showing an I-V curve.

Subsequently, FIG. 8A is a schematic view corresponding to FIG. 4, and FIG. 8B is a graph showing an I-V curve. FIG. 8A is an explanatory view particularly illustrating the case where a potential of 110 V is applied to the one end portion ED1 of the resistance region RR by a surge charge entering the input terminal IN illustrated in FIG. 2. As illustrated in FIG. 8A, the potential of the one end portion ED1 of the resistance region RR is fixed to a potential of 110 V. On the other hand, in the semiconductor device SD1 of the present embodiment, a reverse bias of 110 V is applied between the buried semiconductor region BSR and the isolated semiconductor region ISO, and as a result, a leakage current flowing between them increases. As a result, the leakage current increases in the epitaxial layer EPI, the sinker region SKR, and the buried semiconductor region BSR, so that a potential drop according to Ohm's law is increased, as illustrated in FIG. 8A. As a result, the potential of the epitaxial layer EPI becomes, for example, approximately 109.3 V, and that of the buried semiconductor region BSR becomes, for example, 109 V, as illustrated in FIG. 8A. In the state illustrated in FIG. 8A, the potential of the one end portion ED1 of the resistance region RR is fixed to a potential of 110 V, but that of the epitaxial layer EPI in contact with the resistance region RR becomes considerably lower than that of the one end portion ED1 of the resistance region RR, as described above. As a result, a forward bias is applied to the p-n junction between the one end portion ED1 of the resistance region RR and the epitaxial layer EPI and this forward bias (0.7 V) reaches the built-in potential (0.7 V) of the p-n junction, and hence a current starts flowing from the one end portion ED1 of the resistance region RR to the epitaxial layer EPI. That is, in a parasitic bipolar transistor (PNP bipolar transistor) having the resistance region RR as an emitter, the epitaxial layer EPI as a base, and the semiconductor substrate 1S as a collector, a current starts flowing from the emitter toward the base in the state illustrated in FIG. 8A. The state illustrated in FIG. 8A corresponds to the point (3) of the I-V curve illustrated in FIG. 8B, and corresponds to a point immediately before the parasitic bipolar transistor starts operating.

Figure 9A:
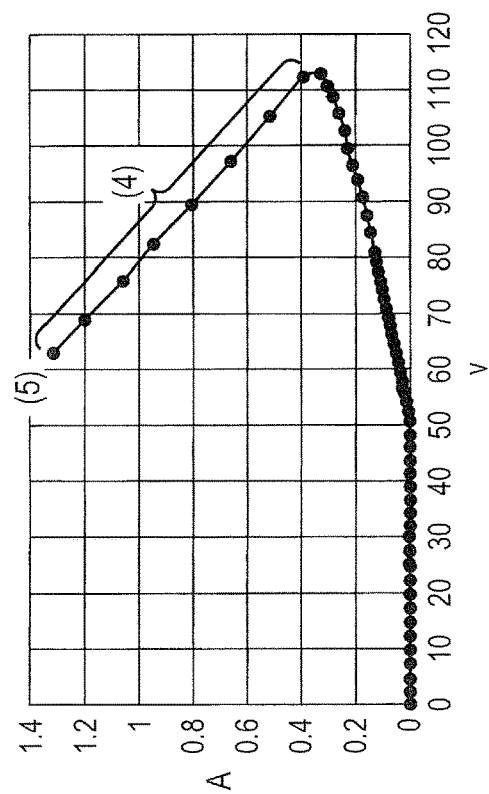
FIG. 9A is a schematic view corresponding to FIG. 4.
Figure 9B:
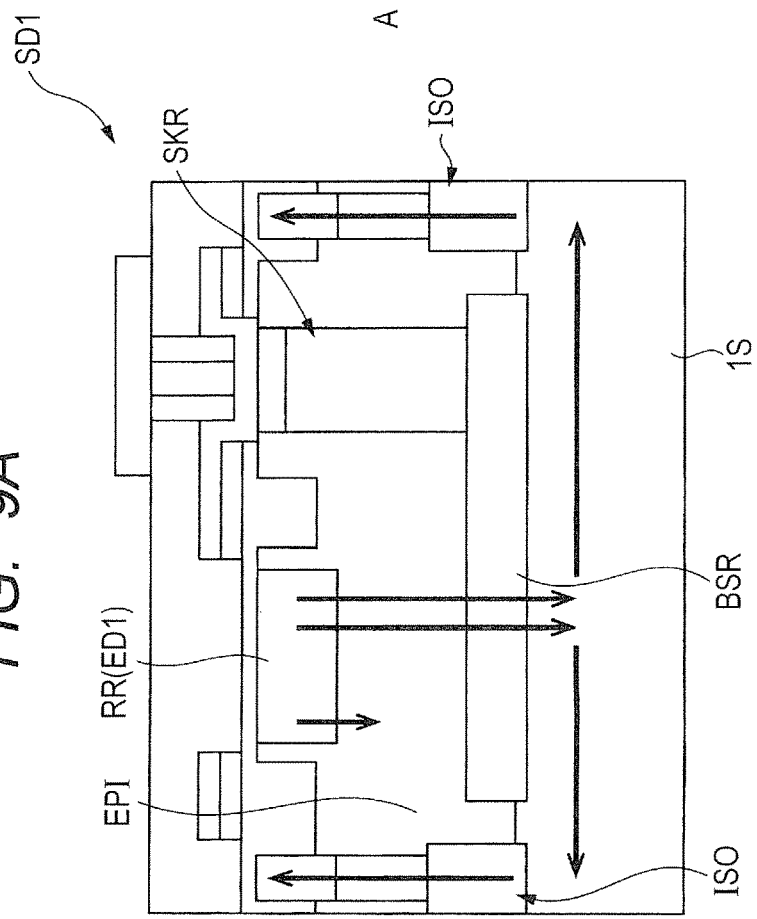
FIG. 9B is a graph showing an I-V curve.

Thereafter, FIG. 9A is a schematic view corresponding to FIG. 4, and FIG. 9B is a graph showing an I-V curve. FIG. 9A is an explanatory view particularly illustrating the case where the parasitic bipolar transistor is turned on when a potential of 110 V is applied to the one end portion ED1 of the resistance region RR by a surge charge entering the input terminal IN illustrated in FIG. 2. In a parasitic bipolar transistor (PNP bipolar transistor) having the resistance region RR as an emitter, the epitaxial layer EPI as a base, and the semiconductor substrate 1S as a collector, a current flows from the emitter toward the base, as illustrated in FIG. 9A, and as a result, the parasitic bipolar transistor is turned on. Thereby, a large current flows from the one end portion ED1 of the resistance region RR to the semiconductor substrate 1S via the epitaxial layer EPI and the buried semiconductor region BSR. The state illustrated in FIG. 9A corresponds to the range (4) of the I-V curve illustrated in FIG. 9B. As illustrated in FIG. 9B, a large current flows from the one end portion ED1 (emitter) of the resistance region RR toward the semiconductor substrate 1S (collector) when the parasitic bipolar transistor is turned on. As a result, a surge charge entering the input terminal IN illustrated in FIG. 2 is passed to the ground terminal GND, and hence the potential to be applied to the one end portion ED1 of the resistance region RR decreases. The point (5) illustrated in FIG. 9B indicates a point where as a result that the semiconductor element SD1 of the present embodiment thermally breaks down due to a large current, it becomes unable to flow any further current, and this current value indicates the electrostatic breakdown tolerance of the semiconductor element SD1 of the embodiment.

According to the semiconductor element SD1 of the present embodiment, the parasitic bipolar transistor is turned on when surge charges entering the input terminal IN illustrated in FIG. 2 reach a predetermined charge amount, whereby the surge charges can be caused to flow to the ground terminal GND, as described above. That is, according to the semiconductor element SD1 of the embodiment, an increase in the potential of the input terminal IN, occurring due to a surge charge, is suppressed before the potential of the input terminal IN reaches the breakdown voltage of the input transistor Tr coupled to the input terminal IN with the parasitic bipolar transistor provided in the semiconductor element SD1 turned on, and as a result, the breakdown of the input transistor Tr, occurring due to a surge charge, can be effectively suppressed.

<Characteristics of Embodiment>

Characteristics of the present embodiment will now be described. The first characteristic of the embodiment is that instead of providing a dedicated electrostatic protection element, the function of an electrostatic protection element is added to another semiconductor element having another function. That is, a function as an electrostatic protection element is also added to a semiconductor element having another function in the embodiment. Thereby, there is no need to provide a dedicated electrostatic protection element according to the first characteristic of the embodiment, and hence the electrostatic breakdown tolerance of a semiconductor device can be improved, and the miniaturization thereof can be achieved as well.

In the present embodiment, the semiconductor element SD1 having a device structure, in which the parasitic bipolar transistor Q having an electrostatic protection function is added, is particularly formed in the resistance element R having a function different from an electrostatic protection function, as illustrated, for example, in FIG. 2. Specifically, in the embodiment, a device structure of a parasitic bipolar transistor functioning as an electrostatic protection element is added to a device structure having the resistance region RR functioning as a resistance element, as illustrated in FIG. 4. That is, in the device structure of the semiconductor element SD1 illustrated in FIG. 4, a parasitic bipolar transistor is formed by a PNP bipolar transistor having the resistance region RR as an emitter, the epitaxial layer EPI and the buried semiconductor region BSR as a base, and the semiconductor substrate 1S as a collector. In the embodiment, a contrivance is made in the device structure of the parasitic bipolar transistor such that it functions as an electrostatic protection element, and this contrivance is the second characteristic of the embodiment.

That is, the second characteristic of the present embodiment is that the sinker region SKR is formed as illustrated, for example, in FIG. 4, the sinker region SKR being in contact with the buried semiconductor region BSR, reaching the surface of the epitaxial layer EPI, and including an n-type semiconductor region having a higher impurity concentration than the epitaxial layer EPI. That is, the second characteristic of the embodiment is that the sinker region SKR including the n-type semiconductor region NR2 is formed in the epitaxial layer EPI.

Thereby, according to the semiconductor element SD1 of the present embodiment, when surge charges entering the input terminal IN illustrated in FIG. 2 reach a predetermined charge amount, the surge charges can be caused to flow to the ground terminal GND by turning on the parasitic bipolar transistor, as described in the above <Operations of Semiconductor Element>. That is, according to the semiconductor element SD1 of the embodiment, an increase in the potential of the input terminal IN, occurring due to a surge charge, is suppressed before the potential of the input terminal IN reaches the breakdown voltage of the input transistor Tr coupled to the input terminal IN with the parasitic bipolar transistor provided in the semiconductor element SD1 turned on, and as a result, the breakdown of the input transistor Tr, occurring due to a surge charge, can be effectively suppressed.

In the present embodiment, the sinker region SKR including the n-type semiconductor region NR2 is particularly provided in a leakage current path (current path illustrated in FIG. 7A, including the sinker region SKR→the buried semiconductor region BSR→the isolated semiconductor region ISO in this order) (second characteristic). Therefore, according to the embodiment, the parasitic bipolar transistor can be operated more stably than a device structure without the sinker region SKR. Hereinafter, this point will be described.

Figure 10B:
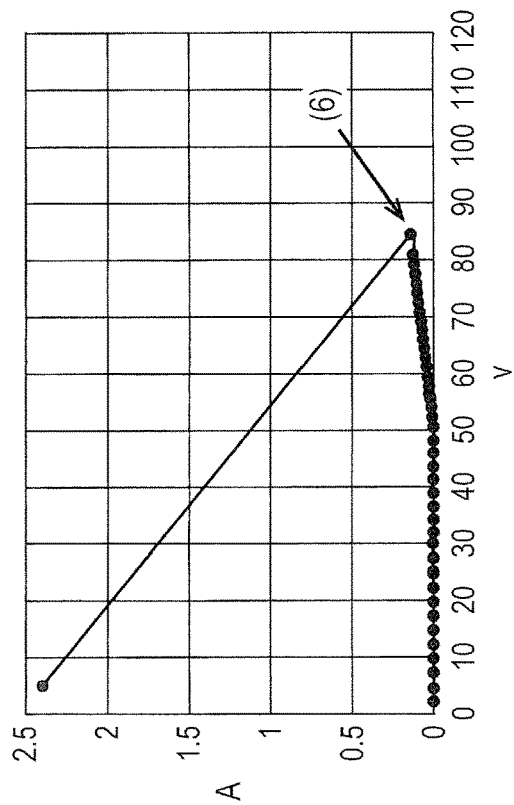
FIG. 10B is a graph showing an I-V curve in the technique under consideration.
Figure 10A:
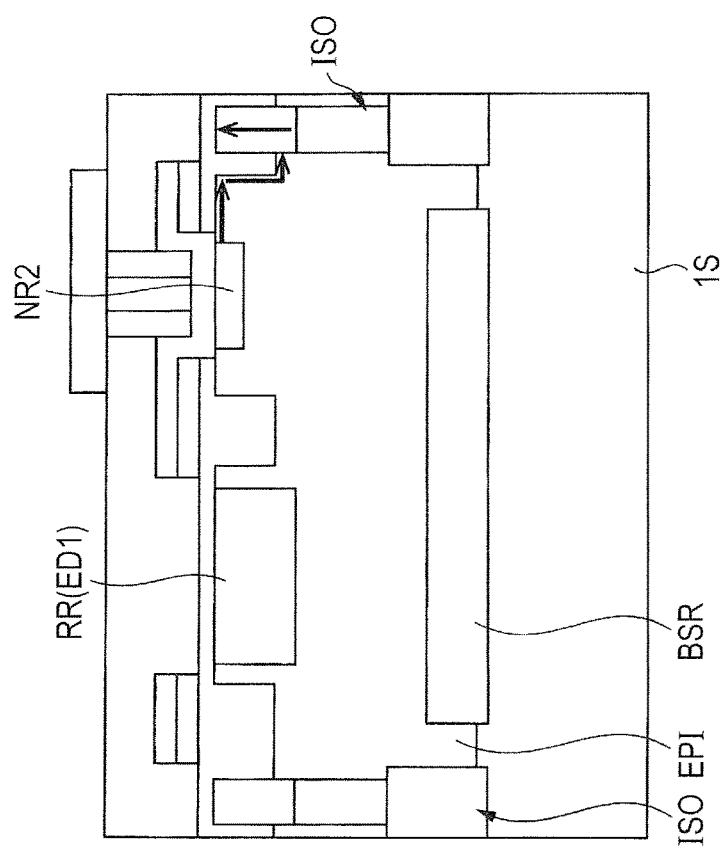
FIG. 10A is a schematic view illustrating a device structure in a technique under consideration.

FIGS. 10A and 10B are schematic views illustrating a technique under consideration in which the sinker region SKR including the n-type semiconductor region NR2 is not formed. Specifically, FIG. 10A is a schematic view illustrating a device structure in the technique under consideration, and FIG. 10B is a graph showing an I-V curve in the technique under consideration.

First, the case, in which the sinker region SKR is not formed in the technique under consideration illustrated in FIG. 10A, will betaken into consideration. In this case, if a sudden potential variation occurs due to a surge charge, a reverse bias is applied to the p-n junction, and the breakdown of the p-n junction, occurring due to the reverse bias, is caused in a local deep region between the buried semiconductor region BSR and the isolated semiconductor region ISO illustrated in FIG. 10A. In the technique under consideration, however, after the breakdown occurs, a leakage current, occurring due to the breakdown, flows through a current path including the n-type semiconductor region NR2→the surface of the epitaxial layer EPI→the isolated semiconductor region ISO in this order with an increase in the leakage current, as illustrated by the path indicated by the arrows in FIG. 10A. When the surface of the epitaxial layer EPI serves as a current path for a leakage current in this way, a "current burn mark" such as "earthworm" crawling is formed over the surface of the epitaxial layer EPI even with a small current, and a short-circuit failure occurs along the "current burn mark" and between the epitaxial layer EPI and the isolated semiconductor region ISO. That is, in the technique under consideration, a "current burn mark" is formed over the surface of the epitaxial layer EPI as a result that a leakage current flows thereover, and due to this "current burn mark", the epitaxial layer EPI and the isolated semiconductor region ISO are electrically conducted with each other.

On the other hand, in the device structure of the semiconductor element SD1 of the present embodiment illustrated, for example, in FIG. 4, the sinker region SKR including the n-type semiconductor region NR1 is formed. In this case, the breakdown of the p-n junction, occurring due to a surge charge, is caused in a local deep region between the buried semiconductor region BSR and the isolated semiconductor region ISO, as illustrated in FIG. 7A. Because the sinker region SKR having a higher impurity concentration than the epitaxial layer EPI is formed in the embodiment, a leakage current flows into the sinker region SKR having a low resistance, not flowing over the surface of the epitaxial layer EPI having a high resistance, even if the leakage current increases thereafter. That is, when the second characteristic of the embodiment, in which the sinker region SKR including the n-type semiconductor region NR1 is formed, is adopted, the surface of the epitaxial layer EPI never serves as a current path for a leakage current. As a result, a "current burn mark" can be avoided from being formed over the surface of the epitaxial layer EPI according to the semiconductor element SD1 of the embodiment, whereby a conduction failure between the epitaxial layer EPI and the isolated semiconductor region ISO, occurring due to the "current burn mark", can be prevented. Therefore, according to the semiconductor element SD1 of the embodiment, the sinker region SKR including the n-type semiconductor region NR1 is formed, and hence a large leakage current can be caused to flow, and as a result, a parasitic bipolar transistor can be operated without forming a "current burn mark."

In the present embodiment, the reason why a leakage current path, occurring after the breakdown of the p-n junction, can be stably held in a local deep position between the buried semiconductor region BSR and the isolated semiconductor region ISO, as described above is because the sinker region SKR including the n-type semiconductor region NR1 is provided. That is, in the embodiment, the potential of the buried semiconductor region BSR is stably fixed by providing the sinker region SKR having a high impurity concentration and a low resistance value, and as a result, the electric field between the buried semiconductor region BSR and the isolated semiconductor region ISO can be held large. That is, the resistance value of a path for a leakage current flowing through the sinker region SKR is decreased by the sinker region SKR including the n-type semiconductor region NR1 having a higher impurity concentration than the epitaxial layer EPI. As a result, the potential of the buried semiconductor region BSR becomes less susceptible to a voltage drop and the potential difference between the buried semiconductor region BSR and the isolated semiconductor region ISO can be stably kept, and hence the electric field between the buried semiconductor region BSR and the isolated semiconductor region ISO can be kept large.

On the other hand, in the technique under consideration in which the sinker region SKR is not provided, the epitaxial layer EPI having a low impurity concentration and a high resistance value is only present between the n-type semiconductor region NR2 and the buried semiconductor region BSR that are illustrated, for example, in FIG. 10A. Therefore, a voltage drop occurring due to the epitaxial layer EPI increases as a leakage current increases, so that the potential of the buried semiconductor region BSR is greatly affected by the voltage drop such that the potential difference between the buried semiconductor region BSR and the isolated semiconductor region ISO becomes small. This means that it becomes difficult to keep the electric field between the buried semiconductor region BSR and the isolated semiconductor region ISO large. As a result, in the technique under consideration, the leakage current path indicated by the arrows in FIG. 10A is more likely to break down, not a local deep region between the buried semiconductor region BSR and the isolated semiconductor region ISO, as a leakage current increases, and hence a leakage current flows along the path indicated by these arrows. As a result, a "current burn mark" such as "earthworm" crawling is formed over the surface of the epitaxial layer EPI, and along this "current burn mark", a short-circuit failure is caused between the epitaxial layer EPI and the isolated semiconductor region ISO. That is, in the technique under consideration, a "current burn mark" is formed over the surface of the epitaxial layer EPI as a result that a leakage current flows thereover, and due to this "current burn mark", the epitaxial layer EPI and the isolated semiconductor region ISO are electrically conducted with each other.

FIG. 10B illustrates a graph showing an I-V curve in the technique under consideration. It can be seen that at the point (6) illustrated in FIG. 10B, a current sharply increases and a voltage decreases. This is because, in the technique under consideration, a leakage current flows along the surface of the epitaxial layer EPI, so that a "current burn mark" is formed over the surface thereof, whereby the epitaxial layer EPI and the isolated semiconductor region ISO are conducted with each other, as described above. That is, in the technique under consideration, a short-circuit failure is caused between the epitaxial layer EPI and the isolated semiconductor region ISO due to the "current burn mark" before the parasitic bipolar transistor is turned on. Therefore, in the technique under consideration, the current value indicated by the point (6) shows the capability of passing a surge charge, and it can be shown that this current value is only approximately one tenth of the capability of passing a surge charge in the present embodiment (point (5) in FIG. 9B).

From this, it can be seen that it is important to stably turn on the parasitic bipolar transistor in order to improve the capability of passing a surge charge. In this respect, the sinker region SKR including the n-type semiconductor region NR1 having a higher impurity concentration than the epitaxial layer EPI is formed in the semiconductor element SD1 of the present embodiment, and hence the parasitic bipolar transistor can be turned on without forming a "current burn mark" over the surface of the epitaxial layer EPI. Therefore, according to the second characteristic of the embodiment in which the sinker region SKR including the n-type semiconductor region NR1 is formed, a parasitic bipolar transistor having a function of passing a surge charge can be stably turned on. From this, an increase in the potential of the input terminal IN, occurring due to a surge charge, is suppressed before reaching the breakdown voltage of the input transistor Tr coupled to the input terminal IN, and as a result, the breakdown of the input transistor Tr, caused by a surge charge, can be effectively suppressed according to the embodiment.

<Manufacturing Method of Semiconductor Device>

Next, a manufacturing method of a semiconductor device including the semiconductor element SD1 of the present embodiment will be described with reference to the views.

FIG. 11A is a sectional view illustrating a manufacturing step of a semiconductor device corresponding to FIG. 4, and FIG. 11B is a sectional view illustrating a manufacturing step of a semiconductor device corresponding to FIG. 5. First, the semiconductor substrate 1S, into which p-type impurities such as, for example, boron (B) have been introduced, is provided, as illustrated in FIGS. 11A and 11B. Then, the buried semiconductor region BSR including an n-type semiconductor region and the p-type semiconductor region PR1 are formed over the surface of the semiconductor substrate 1S by using a photolithography technique and an ion implantation process. Then, the epitaxial layer EPI including an n-type semiconductor layer is formed over the semiconductor substrate 1S by using an epitaxial growth process. The buried semiconductor region BSR and the p-type semiconductor region PR1 are formed across the semiconductor substrate 1S and the epitaxial layer EPI by a heat treatment performed at this time, as illustrated in FIGS. 11A and 11B. Thereafter, a silicon oxide film OXF is formed over the surface of the epitaxial layer EPI by using, for example, a thermal oxidation process.

Next, FIG. 12A is a sectional view illustrating a manufacturing step of a semiconductor device following FIG. 11A, and FIG. 12B is a sectional view illustrating a manufacturing step of a semiconductor device following FIG. 11B. As illustrated in FIGS. 12A and 12B, an n-type semiconductor region NR and a p-type semiconductor region PR are formed in the surface of the epitaxial layer EPI by using a photolithography technique and anion implantation process.

Subsequently, FIG. 13A is a sectional view illustrating a manufacturing step of a semiconductor device following FIG. 12A, and FIG. 13B is a sectional view illustrating a manufacturing step of a semiconductor device following FIG. 12B. As illustrated in FIGS. 13A and 13B, a heat treatment is performed on the semiconductor substrate 1S over which the epitaxial layer EPI has been formed. Thereby, the n-type semiconductor region NR1 leading to the buried semiconductor region BSR is formed with n-type impurities (such as phosphorus) diffusing from the n-type semiconductor region NR formed over the surface of the epitaxial layer EPI. The impurity concentration of the n-type semiconductor region NR1 is higher than that of the epitaxial layer EPI. Further, the p-type semiconductor region PR2 leading to the p-type semiconductor region PR1 is formed with p-type impurities (such as boron) diffusing from the p-type semiconductor region PR formed in the surface of the epitaxial layer EPI.

Subsequently, FIG. 14A is a sectional view illustrating a manufacturing step of a semiconductor device following FIG. 13A, and FIG. 14B is a sectional view illustrating a manufacturing step of a semiconductor device following FIG. 13B. As illustrated in FIGS. 14A and 14B, the isolation insulating film LS is formed in a partial region of the surface of the epitaxial layer EPI by using, for example, a selective oxidation process.

Next, FIG. 15A is a sectional view illustrating a manufacturing step of a semiconductor device following FIG. 14A, and FIG. 15B is a sectional view illustrating a manufacturing step of a semiconductor device following FIG. 14B. As illustrated in FIGS. 15A and 15B, the resistance region RR including a p-type semiconductor region is formed in a partial region of the surface of the epitaxial layer EPI and the p-type semiconductor region PR3 is formed at a position planarly overlapping the p-type semiconductor region PR2, by using a photolithography technique and an ion implantation process. Thereby, the isolated semiconductor region ISO including the p-type semiconductor region PR1, the p-type semiconductor region PR2, and the p-type semiconductor region PR3 is formed.

Subsequently, FIG. 16A is a sectional view illustrating a manufacturing step of a semiconductor device following FIG. 15A, and FIG. 16B is a sectional view illustrating a manufacturing step of a semiconductor device following FIG. 15B. As illustrated in FIGS. 16A and 16B, the silicon nitride film SNF is formed over the isolation insulating film LS formed in the surface of the epitaxial layer EPI by using, for example, a CVD (Chemical Vapor Deposition) process. Then, the silicon nitride film SNF and the isolation insulating film LS over the n-type semiconductor region NR1 are removed by using a photolithography technique and an etching technique. Thereby, the opening OP that exposes the n-type semiconductor region NR1 is formed.

Subsequently, FIG. 17A is a sectional view illustrating a manufacturing step of a semiconductor device following FIG. 16A, and FIG. 17B is a sectional view illustrating a manufacturing step of a semiconductor device following FIG. 16B. As illustrated in FIGS. 17A and 17B, the polysilicon film PF is formed over the silicon nitride film SNF including the inside of the opening OP. The polysilicon film PF can be formed by using, for example, a CVD process. Then, n-type impurities such as arsenic (As) are introduced into the polysilicon film PF by using, for example, an ion implantation process.

Next, FIG. 18A is a sectional view illustrating a manufacturing step of a semiconductor device following FIG. 17A, and FIG. 18B is a sectional view illustrating a manufacturing step of a semiconductor device following FIG. 17B. As illustrated in FIGS. 18A and 18B, the n-type impurities such as arsenic (As) introduced into polysilicon film PF are diffused, in the opening OP, into the n-type semiconductor region NR1 formed over the surface of the epitaxial layer EPI by performing a heat treatment on the semiconductor substrate 1S, whereby the n-type semiconductor region NR2 is formed. Thereby, the sinker region SKR including the n-type semiconductor region NR1 and the n-type semiconductor region NR2 can be formed.

Subsequently, FIG. 19A is a sectional view illustrating a manufacturing step of a semiconductor device following FIG. 18A, and FIG. 19B is a sectional view illustrating a manufacturing step of a semiconductor device following FIG. 18B. As illustrated in FIGS. 19A and 19B, the polysilicon film PF and the silicon nitride film SNF are patterned by using a photolithography technique and an etching technique. With this patterning, the polysilicon film PF and the silicon nitride film SNF over the resistance region RR and the isolated semiconductor region ISO are removed.

Next, FIG. 20A is a sectional view illustrating a manufacturing step of a semiconductor device following FIG. 19A, and FIG. 20B is a sectional view illustrating a manufacturing step of a semiconductor device following FIG. 19B. As illustrated in FIGS. 20A and 20B, the interlayer insulating film IL including, for example, a silicon oxide film is formed. Then, the plug PLG1 to be coupled to the one end portion ED1 of the resistance region RR is formed, and the plug PLG2 to be coupled to the other end portion ED2 thereof is formed, as illustrated in FIG. 20B. Further, the plug PLG3 to be coupled to the polysilicon film PF electrically coupled to the sinker region SKR is formed, as illustrated in FIG. 20A.

Subsequently, FIG. 21A is a sectional view illustrating a manufacturing step of a semiconductor device following FIG. 20A, and FIG. 21B is a sectional view illustrating a manufacturing step of a semiconductor device following FIG. 20B. As illustrated in FIGS. 21A and 21B, an aluminum film is formed over the interlayer insulating film IL by using, for example, a sputtering process. Then, the aluminum film is patterned by using a photolithography technique and an etching technique. Thereby, the wiring WL1 and the wiring WL2, each including an aluminum film, can be formed. At this time, the wiring WL1 is formed so as to be electrically coupled to the plugs PLG1 and PLG3, and the wiring WL2 is formed so as to be electrically coupled to the plug PLG2. The semiconductor device of the present embodiment can be manufactured in the above way.

<First Variation>

Next, a device structure of a semiconductor element SD2 of First Variation of the present embodiment will be described. FIG. 22 is a plan view illustrating a planar device structure of the semiconductor element SD1 of First Variation. As illustrated in FIG. 22, the semiconductor element SD2 of First Variation has an epitaxial layer EPI surrounded by an isolated semiconductor region ISO, and in plan view a buried semiconductor region BSR included in the epitaxial layer EPI is formed so as to extend in the x direction. Further, a resistance region RR and a sinker region SKR are formed so as to be included in the buried semiconductor region BSR in plan view, both the regions RR and SKR being arranged in a straight line along the x direction. Thereby, the planar size of the semiconductor element SD2 can be reduced according to First Variation.

FIG. 23 is a sectional view, taken along the line A-A in FIG. 22. As illustrated in FIG. 23, the buried semiconductor region BSR is coupled to a wiring WL1 via the sinker region SKR, a polysilicon film PF, and a plug PLG3. Meanwhile, the resistance region RR is formed to be aligned in the x direction and spaced apart from the sinker region SKR, and one end portion ED1 of the resistance region RR is coupled to the wiring WL1 via a plug PLG1. Therefore, the resistance region RR and the buried semiconductor region BSR are electrically coupled to each other. The other end portion ED2 of the resistance region RR is coupled to a wiring WL2 via a plug PLG2.

The semiconductor element SD2 of First Variation is configured as described above. In the semiconductor element SD2 of First Variation configured as described above, the sinker region SKR is arranged at a position that is spaced apart from and adjacent to the one end portion ED1 of the resistance region RR, as illustrated, for example, in FIG. 22, and hence the sinker region SKR and the resistance region RR are arranged in a straight line along the x direction. As a result, the planar layout area of the semiconductor element SD2 can be reduced according to First Variation. That is, the miniaturization of the semiconductor element SD2 can be achieved according to First Variation by: an effect of reducing the size based on the basic idea that a parasitic bipolar transistor having an electrostatic protection function is added to a resistance element having a function different from an electrostatic protection function; and an effect of reducing the planar size based on the configuration in which the sinker region SKR and the resistance region RR are arranged in a straight line along the x direction.

<Second Variation>

Subsequently, a device structure of a semiconductor element SD3 of Second Variation of the present embodiment will be described. FIG. 24 is a plan view illustrating a planar device structure of the semiconductor element SD3 of Second Variation. As illustrated in FIG. 24, the semiconductor element SD3 of Second Variation has an epitaxial layer EPI surrounded by an isolated semiconductor region ISO. Further, a buried semiconductor region BSR is formed so as to be included in the epitaxial layer EPI in plan view. Furthermore, a resistance region RR, which is included in the buried semiconductor region BSR and extends in the x direction in plan view, is formed. Still furthermore, a sinker region SKR, included in the buried semiconductor region BSR in plan view, is also formed. In this case, the sinker region SKR has a portion P1 extending in the x direction in plan view and a portion P2 extending in the x direction in parallel with the portion P1 in plan view, as illustrated in FIG. 24. As illustrated in FIG. 24, the resistance region RR is arranged, in plan view, at a position interposed between the portions P1 and P2 of the sinker region SKR.

FIG. 25 is a sectional view, taken along the line A-A in FIG. 24. As illustrated in FIG. 25, the portion P1 of the sinker region SKR is coupled to the left end portion of the buried semiconductor region BSR, and the portion P2 thereof is coupled to the right end portion of the buried semiconductor region BSR. The resistance region RR is formed in the surface of the epitaxial layer EPI above the buried semiconductor region BSR. Therefore, it can be seen that the resistance region RR is formed so as to be interposed between the portions P1 and P2 of the sinker region SKR, as illustrated in FIG. 25.

As described above, the technical idea of the present embodiment can be embodied also as the configuration of the semiconductor element SD3 of Second Variation illustrated in FIGS. 24 and 25.

<Third Variation>

Next, a device structure of a semiconductor element SD4 of Third Variation of the present embodiment will be described. FIG. 26 is a sectional view illustrating a sectional device structure of the semiconductor element SD4 of Third Variation. As illustrated in FIG. 26, a characteristic of the semiconductor element SD4 of Third Variation is that a distance L1 between one end portion A1 of a buried semiconductor region BSR and one end portion B1 of an isolated semiconductor region ISO is smaller than a distance L2 between the other end portion A2 of the buried semiconductor region BSR and the other end portion B2 of the isolated semiconductor region ISO in section view.

In this case, the electric field strength between the one end portion A1 of the buried semiconductor region BSR and the one end portion B1 of the isolated semiconductor region ISO becomes higher than that between the other end portion A2 of the buried semiconductor region BSR and the other end portion B2 of the isolated semiconductor region ISO. As a result, breakdown occurs only between the one end portion A1 of the buried semiconductor region BSR and the one end portion B1 of the isolated semiconductor region ISO, so that a leakage current flows. That is, a leakage current path is fixed according to Third Variation, and hence a stable current can be obtained, whereby a parasitic bipolar transistor can be stably turned on.

The invention made by the present inventors has been specifically described above based on its preferred embodiments, but it is needless to say that the invention should not be limited to the embodiments and may be modified variously within a range not departing from the gist thereof.

What is claimed is:

1. A semiconductor device comprising:
a semiconductor substrate of a first conductivity type;
an epitaxial layer of a second conductivity type opposite to the first conductivity type;
a resistance region of the first conductivity type formed in the epitaxial layer;
a buried semiconductor region of the second conductivity type that is formed across a boundary between the semiconductor substrate and the epitaxial layer and has a higher impurity concentration than the epitaxial layer;
a first semiconductor region of the second conductivity type that is in direct contact with the buried semiconductor region, reaches the surface of the epitaxial layer, is electrically coupled to the resistance region, and has a higher impurity concentration than the epitaxial layer; and
an isolated semiconductor region of the first conductivity type that is formed to be spaced apart from the buried semiconductor region and is in contact with the semiconductor substrate,
wherein the resistance region extends in a first direction in plan view, and
wherein the first semiconductor region includes:
a first portion extending, in plan view, in the first direction; and
a second portion extending, in plan view, in the first direction in parallel with the first portion, and
wherein the resistance region is interposed, in plan view, between the first portion of the first semiconductor region and the second portion of the first semiconductor region.

2. The semiconductor device according to claim 1, having:
a function as a resistance element; and
a function as an electrostatic protection element.

3. The semiconductor device according to claim 2,
wherein the resistance element includes the resistance region, and
wherein the electrostatic protection element includes:
a parasitic bipolar transistor having:
the resistance region as an emitter;
the epitaxial layer and the buried semiconductor region as a base; and
the semiconductor substrate as a collector.

4. The semiconductor device according to claim 1, further comprising:
an interlayer insulating film that covers the epitaxial layer;
a first plug that penetrates the interlayer insulating film to reach the resistance region;
a second plug that penetrates the interlayer insulating film to reach the first semiconductor region; and
a wiring that is formed over the interlayer insulating film and is electrically coupled to the first plug and the second plug.

5. The semiconductor device according to claim 1,
wherein the resistance region extends in a first direction in plan view, and
wherein the first semiconductor region extends, in plan view, in the first direction in parallel with the resistance region.

6. The semiconductor device according to claim 1,
wherein the resistance region and the first semiconductor region are arranged in a straight line in plan view.

7. The semiconductor device according to claim 1,
wherein the isolated semiconductor region surrounds the buried semiconductor region in plan view.

8. The semiconductor device according to claim 7,
wherein, in section view, a first distance between one end portion of the buried semiconductor region and the isolated semiconductor region and a second distance between the other end portion of the buried semiconductor region and the isolated semiconductor region are equal to each other.

9. The semiconductor device according to claim 7,
wherein, in section view, the first distance between the one end portion of the buried semiconductor region and the isolated semiconductor region is smaller than the second distance between the other end portion of the buried semiconductor region and the isolated semiconductor region.

10. The semiconductor device according to claim 1, comprising:
an input terminal; and
an input transistor electrically coupled to the input terminal,
wherein the one end portion of the resistance region is electrically coupled to the input terminal, and
wherein the other end portion of the resistance region is electrically coupled to the input transistor.

11. The semiconductor device according to claim 1, wherein the resistance region functions also as a component of a low-pass filter.

12. The semiconductor device according to claim 1, wherein the first conductivity type is a p-type, and
wherein the second conductivity type is an n-type.

13. A semiconductor device comprising:
a semiconductor substrate;
an epitaxial layer formed over the semiconductor substrate;
a resistance element including a semiconductor region formed in the epitaxial layer; and
an electrostatic protection element including a bipolar transistor having the semiconductor region as a component;
a high concentration semiconductor region that is formed in the epitaxial layer, has an impurity concentration higher than that of the epitaxial layer, is electrically coupled to the resistance element, and has a conductivity type opposite to that of the semiconductor region; and
a first semiconductor region that is in direct contact with the high concentration region, reaches the surface of the epitaxial layer, and is electrically coupled to the resistance element, and has a higher impurity concentration than the epitaxial layer,
wherein the bipolar transistor includes:
the resistance element that functions as an emitter;
the high concentration semiconductor region that functions as a base; and
the semiconductor substrate that functions as a collector,
wherein the first semiconductor region includes:
a first portion extending, in plan view, in the first direction; and
a second portion extending, in plan view, in the first direction in parallel with the first portion,
wherein the resistance element is interposed, in plan view, between the first portion of the first semiconductor region and the second portion of the first semiconductor region, and
wherein the first portion of the first semiconductor region and the second portion of the first semiconductor region are separated from one another in a second direction perpendicular to the first direction in the plan view.

14. The semiconductor device according to claim 13, further comprising:
an isolated semiconductor region that surrounds the high concentration semiconductor region in plan view, is electrically coupled to the semiconductor substrate, and has the same conductivity type as that of the semiconductor substrate.

15. A semiconductor device comprising:
a semiconductor substrate of a first conductivity type;
an epitaxial layer of a second conductivity type opposite to the first conductivity type;
a resistance region of the first conductivity type formed in the epitaxial layer;
a buried semiconductor region of the second conductivity type that is formed across a boundary between the semiconductor substrate and the epitaxial layer and has a higher impurity concentration than the epitaxial layer;
a first semiconductor region of the second conductivity type that is in direct contact with the buried semiconductor region, reaches the surface of the epitaxial layer, is electrically coupled to the resistance region, and has a higher impurity concentration than the epitaxial layer; and
an isolated semiconductor region of the first conductivity type that is formed to be spaced apart from the buried semiconductor region and is in contact with the semiconductor substrate,
wherein the resistance region extends in a first direction in plan view, and
wherein the first semiconductor region includes:
a first portion extending, in plan view, in the first direction; and
a second portion extending, in plan view, in the first direction in parallel with the first portion,
wherein the resistance region is interposed, in plan view, between the first portion of the first semiconductor region and the second portion of the first semiconductor region, and
wherein the first portion of the first semiconductor region and the second portion of the first semiconductor region are separated from one another in a second direction perpendicular to the first direction in the plan view.

* * * * *